United States Patent [19]
Kobayashi et al.

[11] Patent Number: 5,428,568
[45] Date of Patent: Jun. 27, 1995

[54] ELECTRICALLY ERASABLE AND PROGRAMMABLE NON-VOLATILE MEMORY DEVICE AND A METHOD OF OPERATING THE SAME

[75] Inventors: Shinichi Kobayashi; Yasushi Terada; Takeshi Nakayama; Yoshikazu Miyawaki; Tomoshi Futatsuya, all of Hyogo, Japan

[73] Assignee: Mitsubishi Denki Kabushiki Kaisha, Tokyo, Japan

[21] Appl. No.: 933,436

[22] Filed: Aug. 20, 1992

[30] Foreign Application Priority Data

Oct. 30, 1991 [JP] Japan .................................. 3-311964
Jan. 6, 1992 [JP] Japan .................................. 4-000410

[51] Int. Cl.⁶ ........................................... G11C 11/34
[52] U.S. Cl. ..................................... 365/185; 365/184; 365/218; 365/900
[58] Field of Search ................. 365/900, 185, 184, 218

[56] References Cited

U.S. PATENT DOCUMENTS 5,267,207 11/1993 Jinbo ............................... 365/185 X
5,270,979 12/1993 Harari et al. ..................... 365/185 X
5,278,786 1/1994 Kawauchi et al. ................... 365/185

FOREIGN PATENT DOCUMENTS 0403822 12/1990 European Pat. Off. .

3-130995 6/1991 Japan .

*Primary Examiner*—Do Hyun Yoo
*Attorney, Agent, or Firm*—Lowe, Price, LeBlanc & Becker

[57] ABSTRACT

In a programming mode of operation of a flash type non-volatile semiconductor memory device, an erase voltage pulse is applied a memory cell to bring the memory cell into an erased state. Then, an after-erase writing operation is executed for a memory cell having a threshold voltage lower than a predetermined threshold voltage under the condition of small change in threshold voltage. Alternatively, an erase voltage pulse is applied only to a memory cell having a threshold voltage greater than a predetermined threshold voltage to carry out erasing. Also, after a memory cell is brought to a depletion state by application of an erase voltage pulse, data writing of "0" and "1" is carried out by injection of electrons into the floating gate. The electron injection rate to the floating gate for writing data "0" is set to be greater than that for writing data "1". The state of storing data "1" corresponds to an erase state. According to this scheme, an excessively erased memory cell does not exist and the distribution range of threshold voltage can be reduced. Furthermore, the reprogramming time period for a memory cell data can be carried out in a short time.

13 Claims, 26 Drawing Sheets

|  | $B_0$ | $B_1$ | $W_0$ | $W_1$ | $SL_1$ | $SL_2$ |
|---|---|---|---|---|---|---|
| ERASE | FL | FL | -9V | 0V | 5V | 0V |
| WRITING 1 | 4V | 4V | 5V | 0V | 0V | 0V |
| WRITING 2 | 4V | 0V | 10V | 0V | 0V | 0V |

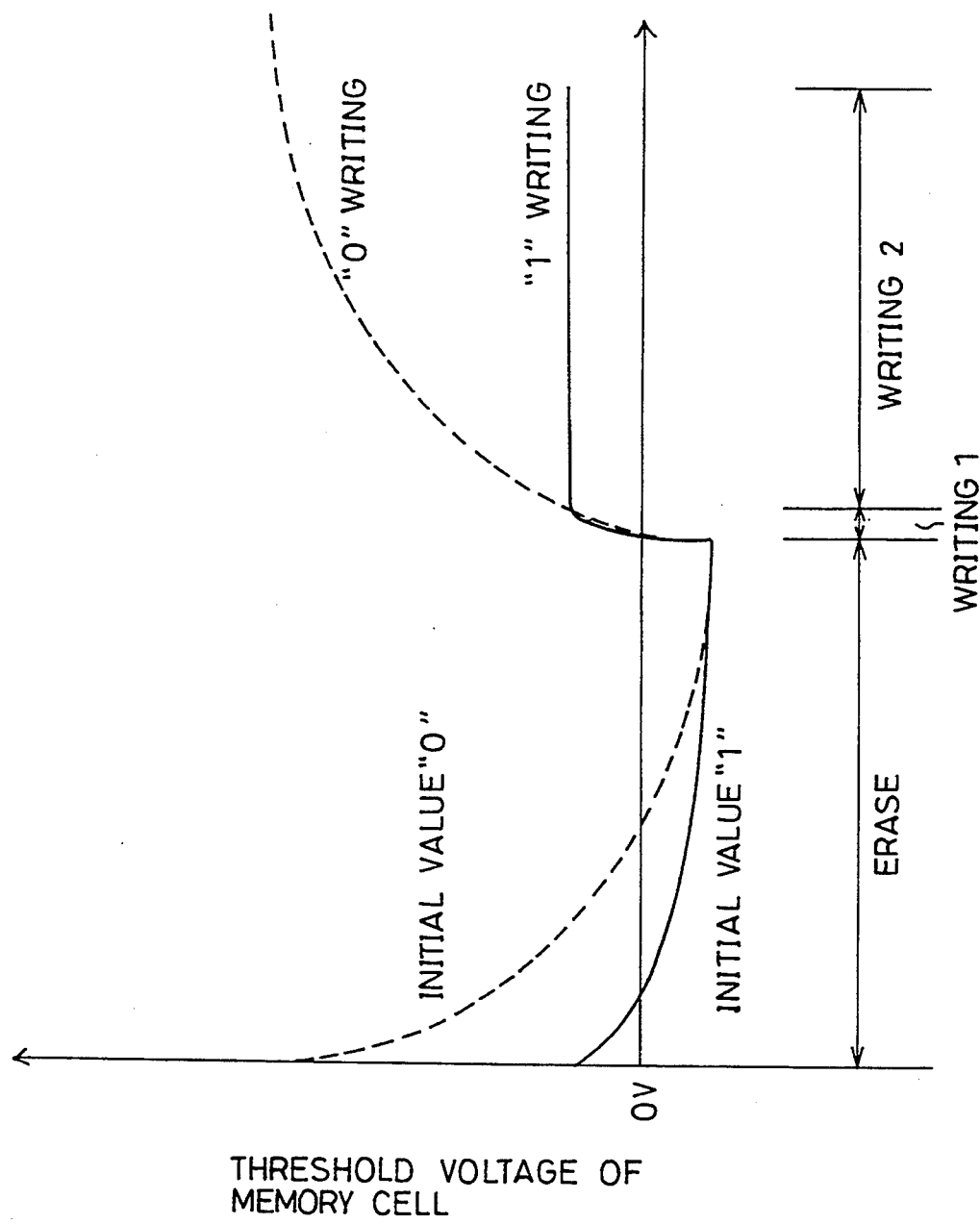

|  | $B_0$ | $B_1$ | $W_0$ | $W_1$ | $SL_1$ | $SL_2$ |
|---|---|---|---|---|---|---|
| ERASE | FL | FL | -9V | 0V | 5V | 0V |
| WRITING 1 | 4V | 4V | 10V | 0V | 0V | 0V |
| WRITING 2 | 4V | 0V | 10V | 0V | 0V | 0V |

ELECTRICALLY ERASABLE AND PROGRAMMABLE NON-VOLATILE MEMORY DEVICE AND A METHOD OF OPERATING THE SAME

BACKGROUND OF THE INVENTION

1. Field of the Invention The present invention relates to an electrically erasable and programmable non-volatile semiconductor memory device (EEPROM) and the method of operating the same, and more particularly, to a flash EEPROM that can erase simultaneously a plurality of bytes of memory cells.

2. Description of the Background Art

EEPROMs are widely used such as in memory devices of IC cards since the stored information is electrically erasable and reprogrammable and the stored information can be retained even while power is off. An EEPROM includes a flash EEPROM that can simultaneously erase a plurality of bytes of memory cells (referred to as "flash memory" hereinafter).

FIG. 1 is a cross sectional view of a conventional flash memory cell. Referring to FIG. 1, a flash memory cell includes N+ type impurity regions 2 and 3 of high impurity concentration having a predetermined space therebetween on the, main surface of a P− type semiconductor substrate 1 of low impurity concentration. Impurity regions 2 and 3 implement a drain region and a source region, respectively. The flash memory cell further includes a floating gate 5 formed above a channel region 7 between impurity regions 2 and 3 with a very thin insulation film 4 of approximately 100 Å thereunder, and a control gate 6 above floating gate 5 with an interlayer insulation film 8 therebetween. The flash memory cell has a double layered gate structure comprising floating gate 5 and control gate 6. Floating gate 5 is electrically isolated from impurity regions 2 and 3 and control gate 6 by means of insulation films 4 and 8, respectively.

The flash memory cell stores information according to the amount of accumulation of charge (electrons) injected into floating gate 5.

An inversion layer is not easily formed in channel region 7 when many electrons are injected in floating gate 5, resulting in a higher threshold voltage of the memory cell. When electrons are discharged from floating gate 5, an inversion layer is easily formed in channel region 7, resulting in a lower threshold voltage of the memory cell. The threshold voltage of a memory cell is the voltage applied to control gate 6, at which an inversion layer of low resistance is formed in channel region 7 between impurity regions 2 and 3 allowing current flow between impurity regions 2 and 3.

FIG. 2 is a graph showing the relationship between the voltage applied to control gate 6 and the charging/discharging state of electrons of floating gate 5. It is appreciated from FIG. 2 that the threshold voltage is high when electrons are injected into floating gate 5, whereby a voltage Vg applied to control gate 6 exceeding Vg0 causes a flow of source/drain current Ids. This state is called a write state and is defined as the state where data "0" is stored.

The threshold voltage is low when electrons are discharged from floating gate 5. In this case a voltage Vg applied to control gate 6 exceeding Vg1 causes a flow of source/drain current Ids (Vg1 < Vg0). This state is called an erase state and is defined as the state where data "1" is stored. A flash memory cell stores binary information of 1 and 0 by taking advantage of change in threshold voltage according to the accumulated amount of electrons (charge/discharge) of floating gate 5. The excessive erased state will be described afterwards.

A conventional data writing and erasing operation of the flash memory cell of FIG. 1 will be described hereinafter. In a normal reprogramming mode of data, the erase operation is first carried out, followed by the writing of data.

At the time of data writing, a writing voltage of approximately 6 V is applied to impurity region 2 serving as a drain region, and a high voltage of approximately 12 V is applied to control gate 6. Impurity region 3 is grounded. Under this state, an inversion layer is formed in channel region 7 where there is a flow of source/drain current Ids since the voltage of control gate 6 is sufficiently higher than threshold voltage Vg0. Here, avalanche breakdown occurs near impurity region 2 because of a high electric field to excite the electrons of the source/drain current to generate hot electrons. These hot electrons are accelerated towards floating gate 5 by the high electric field applied between control gate 6 and drain impurity region 2 to be injected into floating gate 5. This raises the threshold voltage of the flash memory cell to implement a writing state.

At the time of erase operation, a high voltage (approximately 12 V) is applied to source impurity region 3, and control gate 6 is grounded. Drain impurity region 2 attains a floating state. Here, a high electric field is generated between floating gate 5 and source impurity region 3 via a thin gate insulation film 4, whereby electrons from floating gate 5 are discharged to source impurity region 3 as tunneling current to drop the threshold voltage of the flash memory cell. Thus, the erasing state is realized.

The flash memory comprises a memory cell array having a plurality of flash memory cells of the structure of FIG. 1 arranged in a matrix manner. A memory device is implemented by storing desired data in the memory cell in the memory cell array.

FIG. 3 shows the entire structure of a conventional flash memory. Referring to FIG. 3 a flash memory 100 comprises a memory cell array 110 having a plurality of flash memory cells arranged in a matrix of rows and columns. For the sake of simplicity, memory cell array 110 is shown to comprise four flash memory cells 16, 17, 18, and 19 arranged in two rows and two columns in FIG. 3. Memory cell array 110 comprises a word line W (W0, W1) to which memory cells of one row are connected, and a bit line B (B0, B1) to which flash memory cells of one column are connected.

Flash memory 100 further comprises an address buffer 8 to receive an address signal (this may be an external applied signal or may be applied from a processing unit formed on the same chip) for generating an internal address signal, an X decoder 12 for decoding an internal row address signal from address buffer 8 to select a corresponding word line, a Y decoder 9 for decoding an internal column address signal from address buffer 8 for generating a column select signal Y (Y1, Y0) for selecting a corresponding column in memory cell array 110, a sense amplifier 15 for detecting and amplifying the stored data in the memory cell selected by X decoder 12 and Y decoder 9, a writing circuit 20 for writing information into a selected memory cell, and a data input/output buffer 21 for carrying out data input/output with an external source.

A column selector gate circuit 120 is provided between sense amplifier 15 and writing circuit 20, and bit line B (B0, B1) of memory cell array 110 for connecting a corresponding bit line to sense amplifier 15 or writing circuit 20 according to column select signal Y from Y decoder 9. Column selector gate circuit 120 is shown to comprise a Y gate transistor 10 provided corresponding to bit line B0 to attain a conductive state in response to column select signal Y0, and a Y gate transistor 11 provided corresponding to bit line B1 to attain a conductive state in response to column select signal Y1.

Sense amplifier 15 applies a reading voltage to a selected bit line at the time of data reading. Sense amplifier 15 detects the presence/absence of current flowing through that bit line to amplify the information in the selected memory cell, whereby the amplified signal is transmitted to the output circuit included in data input/output buffer 21. The data sensed/amplified by sense amplifier 15 is also supplied to a write/erase control circuit 25 for the verify operation that will be described afterwards. Writing circuit 20 responds to the write data from the input buffer included in data input/output buffer 21 to apply a voltage corresponding to the write data to the selected bit line.

Flash memory 100 further comprises a write/erase control circuit 25 responsive to external control signals, i.e. a chip enable signal CE, an output enable signal OE, and a write enable signal WE, for generating various internal control signals and for controlling the write/erase operation, a Vpp/Vcc switching circuit 22 responsive to a select signal of write/erase control circuit 25 for selecting an externally applied high voltage Vpp or an operating power supply voltage Vcc, a word line voltage modifying circuit 23 for modifying the voltage applied to a word line according to the operation mode of the flash memory under the control of write/erase control circuit 25, and a source potential generating circuit 24 for applying a voltage to each source of the memory cell according to the operation mode under the control of write/erase control circuit 25.

In memory cell array 110, one source line Si (S1, S2) is provided for one unit of memory cells that can be accessed at one time (for example 1 byte). Source line Si is connected to source potential generating circuit 24 via a common source line S. More specifically, memory cells of one access unit arranged in the column direction are connected to the same source line Si. The structure of providing one source line for each access unit of memory cells allows reduction in the wiring area for source lines to achieve larger scale integration.

The voltage generated from word line voltage modifying circuit 23 is applied to X decoder 12. X decoder 12 transmits this voltage to the selected word line as a word line driving signal.

High voltage Vpp is normally 12 V, and operating power supply voltage Vcc is normally 5 V.

Source potential generating circuit 24 generates high voltage Vpp at the time of erasing mode which is transmitted to source line Si. At the time of writing and reading operation mode, source potential generating circuit 24 connects source line Si to ground potential.

Writing circuit 20 provides a writing high voltage (lower than high voltage Vpp, approximately 6 V) at the time of writing data 0 corresponding to write mode, and generates a voltage of ground potential level at the time of writing data 1 corresponding to the erase mode.

Word line voltage modifying circuit 23 is responsive to various operation modes to generate high voltage Vpp, operating power supply voltage Vcc, write verify voltage Vwr, erase verify voltage Ver.

FIG. 4 shows a specific structure of word line voltage modifying circuit 23 of FIG. 3. Referring to FIG. 4, word line voltage modifying circuit 23 comprises resistors 35 and 36 connected in series between node ND1 receiving voltage Vpp/Vcc from Vpp/Vcc switching circuit 22 and ground potential, and an n channel MOS (insulation gate type field effect) transistor 34. Here, "Vpp/Vcc" refers to either voltage Vpp or Vcc. Resistors 35 and 36 have resistances of R1 and R2, respectively. Transistor 34 responds to a verify signal VRFY to attain a conductive state. Voltage Vpp/Vcc or a verify voltage is provided from node ND2 which is the connection node of resistors 35 and 36.

Verify signal VRFY attains an active state of an H level (logical high) at the verify cycles of verifying whether the memory cell is reliably erased at the time of erase operation mode, and of verifying whether write data is reliably written into a selected memory cell at the time of data write operation.

Word line voltage modifying circuit 23 further comprises an inverter circuit 37 for inverting verify signal VRFY, a Vpp switch 38 activated in response to the output of inverter 37 to transmit voltage Vpp/Vcc, a comparison circuit 47 for comparing the voltage on an input line 47a and the voltage on an input line 47b, a p channel MOS transistor 29 attaining a conductive state in response to the voltage on output line 47c of comparison circuit 47 to transmit voltage Vpp/Vcc to X decoder 12 (refer to FIG. 3) via signal line 23a, and an n channel MOS transistor 30 responsive to the output of inverter circuit 37 to reset output line 47c to ground potential.

Comparison circuit 47 comprises a p channel MOS transistor 26 responsive to an output signal of Vpp switch 38 for selectively transmitting voltage Vpp/Vcc to node ND3, a p channel MOS transistor 27 provided between node ND3 and node ND4, a p channel MOS transistor 28 provided between node ND3 and node ND5, an n channel MOS transistor 32 provided between node ND4 and the node ND6, an n channel MOS transistor 31 provided between node ND5 and node ND6, and an n channel MOS transistors 33 provided between node ND6 and ground potential.

Node ND4 is connected to the gates of transistors 27 and 28. As a result, transistors 27 and 28 implement a current mirror circuit where the same amount of current flows through transistors 27 and 28 if their sizes are the same. The gate of transistor 31 is connected to node ND2 via input line 47a. The gate of transistor 32 is connected to signal line 23a via input line 47b. The gate of transistor 33 is supplied with verified signal VRFY. Comparison circuit 47 responds to verify signal VRFY to be activated, and functions to establish the same voltage on signal line 47a and on signal lines 23a and 47b.

FIG. 5 shows a specific structure of Vpp switch 38 of FIG. 4. Referring to FIG. 5, Vpp switch 38 comprises an inverter circuit 145 for inverting an input signal (Vpp switch activation signal), an n channel MOS transistor 143 having its gate connected to operating power supply voltage Vcc for transmitting the output of inverter circuit 145, a p channel MOS transistor 141 and an n channel MOS transistor 144 forming an inverter for inverting the signal transmitted from transistor 143, and a p channel MOS transistor 142 responsive to the signal potential on an output node ND10 for transmitting voltage Vpp/Vcc to node ND11.

Voltage Vpp/Vcc is transmitted to one conduction terminal (source terminal) of transistor 141. When node ND11 attains a high voltage Vpp level, transistor 143 serves to prevent the high voltage Vpp from being applied to the output of inverter circuit 145. Prior to the description of the entire operation of a flash memory, the operation of word line voltage modifying circuit 23 will be described hereinafter with reference to FIGS. 4 and 5.

When verify operation is not carried out, i.e. at the time of the modes of erase operation, data writing, and data reading operation, verify signal VRFY is "low" of ground potential level. Under this state, transistors 33 and 34 are off, and transistor 30 is turned on by a "high" signal (operating power supply voltage Vcc level) from inverter circuit 37.

When transistor 33 is OFF, comparison circuit 47 attains an inactive state since current does not flow thereto. When transistor 34 is OFF, current will not flow across resistors 35 and 36, whereby voltage Vpp/Vcc applied to node ND1 is provided from node ND2. When transistor 30 is ON, the potential of signal line 47c attains a ground potential level of L to turn on transistor 29, whereby voltage Vpp/Vcc is transmitted to signal line 23a.

At the time of verify operation mode, verify signal VRFY attains the operating power supply voltage Vcc level of H. This turns on transistors 33 and 34, and transistor 30 is turned off by the output of inverter circuit 37. Under this state, current flows across resistors 35 and 36 so that voltage Vpp/Vcc applied to node ND1 is resistor-divided by resistances R1 and R2 to be provided from node ND2. The voltage of node ND2 is applied to the gate of transistor 31 of comparison circuit 47 via signal line 47a. Since transistor 33 is ON, comparison circuit 47 carries out the comparison operation.

Because the output of inverter 37 is L, the output of inverter circuit 145 is H in Vpp switch 38,. This turns on transistor 144, whereby the potential of node ND10 attains a low level. Here, voltage Vpp is applied to transistor 141. When the potential of node ND11 attains the level of voltage Vcc, transistor 141 is turned on so that current flows via transistors 141 and 144. If the potential level of node ND10 attains a low level, transistor 142 is turned on so that voltage Vpp/Vcc is transmitted to node ND11. Thus, transistor 141 is reliably turned off, and node ND10 attains a L level of ground potential. In response, transistor 26 of comparison circuit 47 is turned on, whereby the potential of node ND3 attains the level of Vpp/Vcc.

Transistor 31 is turned on in response to the voltage on input line 47a (referred to as "erase verify voltage Ver" hereinafter). The potential of node ND5 takes a value where the voltage between ND3 and node ND6 is resistor-divided by the ON resistances of transistors 28 and 31. At this time, the voltage on output line 47c becomes higher than the ground potential level. In response, transistor 29 approaches the OFF state to have a greater resistance. The voltage on signal line 23a becomes lower than voltage Vpp/Vcc. The voltage on signal line 23a is provided to the gate of transistor 32. In response to the decrease of voltage on signal line 23a, transistor 32 will have a greater resistance to raise the potential of node ND4.

The rise of potential in node ND4 is fedback to the gates of transistors 27 and 28 to result in a greater resistance for transistors 27 and 28. Therefore, the amount of current flowing through transistors 27 and 28 becomes lower. This reduces the potential of node ND5 to lower the resistance of transistor 29 via a signal line 47c, whereby the voltage on signal line 23a is raised.

In other words, comparison circuit 47 operates to equalize the erase verify voltage Ver applied to input line 47a and the voltage on signal line 23a. The voltage transmitted to the X decoder via signal line 23a depends on resistances R1 and R2. An erase verify voltage of a desired voltage level can be generated by setting appropriate resistances of R1 and R2.

When verify signal VRFY is at a low level, node ND11 in Vpp switch 38 of FIG. 5 attains a ground potential low level. A voltage of Vpp/Vcc level is generated in node ND10 to turn off transistor 142. Transistor 26 of comparison circuit 47 is set to an off state since the potentials of the source and gate become identical regardless of voltage Vpp/Vcc. Even if signal line 47c is reset, current will not flow from signal line 47c to transistor 30.

The entire operation of a flash memory will be described hereinafter with reference to FIG. 3. The data writing operation to a memory cell is initiated by a control signal, i.e. chip enable signal CE and write enable signal WE. The writing operation of external data to a selected memory cell comprises an erase operation mode for carrying out erasing of a memory cell, and a write operation mode for actually writing data into a selected memory cell. In the following description, the term "programming mode" refers to both the erase operation mode and writing operation mode. The write operation mode will be described first.

At the time of write operation mode, Vpp/Vcc switching circuit 22 generates a high voltage Vpp under the control of write/erase control circuit 25. Word line voltage modifying circuit 23 has a "low" verify signal to generate a high voltage Vpp which is provided to X decoder 12. Source potential generating circuit 24 connects common source line S to ground potential under the control of write/erase control circuit 25. Thus, each source line Si (S1, S2) is set to ground potential.

Address buffer 8 has the address strobe timing determined by write/erase control circuit 25 to generate an internal address signal from an applied address signal. It is assumed that word line W0 and bit line B0 are selected. In this case, X decoder 12 transmits to word line W0 high voltage Vpp from word line voltage modifying circuit 23. Y decoder 9 pulls up column select signal Y0 to a high level. The voltage of a high level column select signal Y0 is greater than operating power supply voltage Vcc for passing a write high voltage which is greater than power supply voltage Vcc. The implementation of Y decoder 9 for generating a high voltage at the time of writing operation may employ the implementation of generating a voltage by resister-dividing voltage Vpp, as in the case of word line voltage modifying circuit 23 of FIG. 4.

Data input/output buffer 21 receives an externally applied write data D to generate and provide to writing circuit 20 an internal data under the control of write/erase control circuit 25. Also under the control of write/erase control circuit 25, writing circuit 20 generates a write high voltage (approximately 6 V in general) in writing data 0. In writing data 1, a signal of ground potential level is generated. Column select signal Y0 causes Y gate transistor 10 in column selector gate 120 to conduct, whereby a write high voltage is applied to bit line B0. Thus, a high electric field is applied between the control gate and the drain of memory cell 16, whereby injection of hot electrons to the floating gate is carried out. This induces a rise in threshold voltage in memory cell 16 to establish a writing mode for storing data 0. When data 1 is to be written, hot electrons are not generated since a high voltage is not applied to the drain, and injection/ejection of charge towards/from the floating gate does not occur. Actual writing of data 1 is not carried out since all the memory cells are set to an erase state (state of data 1 stored) prior to the data writing operation.

The erase operation mode carried out prior to the data writing operation for setting the memory cell into an erased state will be described hereinafter with reference to the flow chart of FIG. 6.

Write/erase control circuit 25 enters an erase operation mode when chip enable signal CE and write enable signal WE both become active. In this erase operation mode, the flash memory has all the data in all the memory cells erased simultaneously. At this time, a pre-erase writing operation is carried out to establish a similar threshold voltage for all the memory cells (refer to FIG. 6 step S501). The pre-erase writing is the writing of data 0 into all the memory cells.

In the pre-erase writing cycle, writing circuit 20 generates a write high voltage. X decoder 12 selects all the word lines (W0, W1). Y decoder 9 sets all the column select signals Y (Y1, Y0) to an active state. Word line voltage modifying circuit 23 generates a high voltage Vpp which is provided to X decoder 12. Source potential generating circuit 24 generates ground potential which is provided to common source line S. As a result, write high voltage is applied to the drains, and high voltage Vpp is applied to the control gates of all the memory cells of 16, 17, and 18. The source is set to ground potential. Thus, all the memory cells are set to a writing state where data 0 is written therein. This writing operation in all the memory cells to raise the threshold voltage is called a pre-erase writing operation.

On completion of this pre-erase writing operation, all the memory cells are set to an erase state. At this time, X decoder 12 turns all the word lines W0, W1 into a non-selected state having a potential of ground potential level. Y decoder 9 is inactive so that column select signals Y0 and Y1 are set to "low". Thus, bit lines B0 and B1 are set to a floating state. Source potential generating circuit 24 generates high voltage Vpp for a predetermined time under the control of write/erase control circuit 25 to provide the voltage to common source line S. This high voltage Vpp generated for a predetermined time is a pulse signal referred to as an erasing voltage pulse. The application of this erasing voltage pulse causes electrons to be drawn from the floating gate to the source by tunnel effect in each memory cell. As a result, the threshold voltage in the memory cell is lowered (step S502).

Then, a verify operation is carried out for verifying whether the memory cell is set to an erased state. In the verify cycle, source potential generating circuit 24 connects common source line S to ground potential (step S503).

Next, X decoder 12 and Y decoder 9 selects a memory cell of address 0 (step S504). An erase verify voltage Ver from word line voltage modifying circuit 23 via X decoder 12 is transmitted to the word line to which the selected memory cell of address 0 is connected. More specifically, verify signal VRFY is high and verify voltage Ver is generated from signal line 23a in FIG. 4.

It is assumed that the memory cell of address 0 is memory cell 16. The data in memory cell 16 of address 0 is sensed and amplified by sense amplifier 15 to be provided to write/erase control circuit 25. Write/erase control circuit 25 makes determination whether the data provided from sense amplifier 15 is data 1 indicating an erased state (step S506). A read out data of "1" indicates that the threshold voltage of that memory cell is lower than erase verify voltage Ver. This means that memory cell is in an erased state. Write/erase control circuit 25 then makes determination whether the address of the selected memory cell is the last address or not (step S507). If the address of the current selected memory cell is not the last address, the address is incremented by 1 (step S508) and the control returns to step S506. This operation is repeated, and the erase operation mode is completed when determination is made of a memory cell of the last address storing data 1 (step S507).

When determination is made in write/erase control circuit 25 that the read out data is not 1 in a memory cell of an address at step S506, the control returns to step S502 since that memory cell has a threshold voltage greater than a desired erase verify voltage and is verified as to be not in an erased state. An erase voltage pulse of high voltage is applied from source potential generating circuit 24 to the source line, whereby the erase operation for each memory cell is carried out. Then, the memory cell of address 0 is selected again to have its stored data read out. This operation is repeated until the threshold voltage of all the memory cells are verified to be below the erase verify voltage.

Erase verify voltage Ver is set lower than the voltage transferred to the word line in a normal data read out operation.

In a flash memory cell, the erase state is realized by the discharge of electrons from the floating gate. The electron discharge is carried out by generating tunneling current between the, floating gate and the source region. The discharged amount of electrons depends upon the level and width of the erase voltage pulse applied between the floating gate and a source region and the number of times of that application.

In the above-described erase operation mode, pre-erase writing is carried out to make uniform the threshold voltage of the memory cells, followed by lowering the threshold voltage of the memory cell less than a predetermined value (erase verify voltage) by applying an erase voltage pulse and carrying out verify operation.

The source line is provided in common for a unit of access memory cells (for example 1 byte). An interconnection is required for the connection of the source region and the source line, incuring a source resistance. There is an occurrence of different source potential in the memory cells of one access unit caused by this source resistance. This means that even memory cells in one access unit have different discharge amount of electrons at the time of its erase operation, resulting in variation in erase characteristics.

In a memory cell array, the gate insulation film or the channel region may vary depending on variation in the manufacturing process as a local factor. This also is responsible for variation in the erase characteristics of a memory cell.

In the event of variation in erasing characteristics of a memory cell, electrons will be drawn excessively from the floating gate of a memory cell by an application of an erase voltage pulse.

This state of electrons excessively drawn from the floating gate is called an excessive erase state. The threshold voltage of the excessively erased memory cell shows a depletion state. This "depletion state" refers to a state where source/drain current flows to the memory cell even when ground potential is applied to the control gate.

When memory cells having the threshold voltage set to be within a predetermined range (pre-erase writing) are erased to set the threshold voltage of each memory cell to be less than the erase verify voltage Ver, excessively erased memory cells are present as represented by the broken lines of FIG. 7. When a not-erased cell is found at the time of verify operation, an erase voltage pulse is applied again. This pulse will be applied also to the cells already taking an erased state, resulting in excessive erase.

The presence of such excessively-erased memory cells leads to a problem that correct data reading cannot be carried out.

The problem of this excessively erased memory cell will be described with reference to FIG. 8. Referring to FIG. 8, memory cells FM1, FM2 and FM3 are disposed at the crossings of three word lines WL1, WL2, WL3; and a bit line BL. Memory cell FM1 stores data "1" attaining an erased state. Memory cell. FM2 attains an excessive-erased state, storing data "11". Memory cell FM3 attains a writing state, storing data "0".

At the time of data reading, a voltage approximating operating power supply voltage Vcc is transmitted to a selected word line according to an applied address, and a reading voltage is applied to bit line BL for the generation of current. Data reading is carried out by detecting the presence/absence of current on bit line BL by a sense amplifier. It is assumed that memory cell FM2 attains an excessive-erased state. This means that memory cell FM2 always conducts regardless of whether word line WL2 is selected or not. Consider the state where memory cell FM3 is selected. Memory cell FM3 stores data "0" and is non-conductive even if word line W3 is selected. However, memory cell FM2 is conductive even if word line WL2 is not selected so that current flows from bit line BL to source line SL, resulting in a determination that memory cell FM3 stores data "1" which represents an erased state. This means that data "1" is erroneously read out instead of data "0". A flash memory of high reliability cannot be obtained.

In writing data into a memory cell, a writing operation mode for actually writing data into a memory cell is carried out after the above-described erase operation mode.

As shown in FIG. 9, the programming mode requires a sequence for carrying out the erase operation mode, and a sequence for carrying out the write operation mode. The erase operation mode is similar to that shown in the flow of FIG. 6. FIG. 9 shows a more simplified erase operation mode. Briefly, in the operation mode, the pre-erase writing (step S602), is carried out an erase pulse is applied to decrease the threshold voltage in all memory cells (step S603), an erase verify operation is carried out for determining whether the threshold voltage of the memory cell is below a predetermined value (step S604), to complete the erase operation mode when confirmation is made that all the memory cells are under an erased state (step S606).

Following this erase operation mode, a writing operation mode is commenced (step S608). A write data is applied to writing circuit 20, whereby a write pulse is applied to the memory cells having data "0" written therein by writing circuit 20 (step S610). This write pulse applies a predetermined writing high voltage in a pulse-manner to a bit line while applying high voltage Vpp to a word line. Upon applying this write pulse, the contents of the written data is read out. When reading out the contents of the written data, a write verify voltage slightly higher than operating power supply voltage Vcc (the voltage level applied to the word line at the time of normal reading mode) to the selected word line. When the read out data of the memory cell does not match the written data, a write pulse is applied again to the selected memory cell to carry out the write verify operation again (step S612). The match/mismatch detection of the write data and the stored data of the selected memory cell is carried out by write/erase control circuit 25 shown in FIG. 3. If the stored data and the write data match in the writing verify cycle, the writing operation of data into a selected memory cell is completed. This writing operation mode is carried out for all the memory cells to be written. There was a problem that the programming mode is time consuming in a conventional flash memory.

In the erase operation mode, an erase verify operation is required to determine whether each memory cell is set to an erased state after all the memory cells are subjected to the erasing operation. This is responsible for the long time period required for the erase operation mode.

In writing operation mode, writing is carried out for each unit of data writing (normally 1 byte unit). Data writing is carried out for not just 1 byte of memory cells, but sequentially for memory cells of a plurality of bytes, resulting in a longer time for writing mode operation.

Although the erase operation mode and the write operation mode are both executed under the control of the write/erase control circuit, the erase operation mode and the write operation mode respectively have an operation sequence independent of each other. Therefore, the control operation is complicated and the program operation burdensome.

SUMMARY OF THE INVENTION

An object of the present invention is to provide a non-volatile semiconductor memory device capable of writing data into a memory cell easily, reliably, and speedily.

Another object of the present invention is to provide a non-volatile semiconductor memory device that can have the time required for erase operation mode reduced.

A further object of the present invention is to provide a non-volatile semiconductor memory device that can carry out erase operation stably and reliably regardless of variation in the erase characteristics of a memory cell.

Still another object of the present invention is to provide a non-volatile semiconductor memory device that can have the distribution range of threshold voltage after erasing reduced.

A non-volatile semiconductor memory device according to an aspect of the present invention includes: a memory cell array having a plurality of memory cells arranged in a matrix of rows and columns, each formed of a floating gate type transistor for storing data representing a write state and an erase state according to the amount of accumulated charge in the floating gate; a plurality of word lines disposed corresponding to each row of the memory cell array, each having a memory cell of a corresponding row connected thereto; a plurality of bit lines disposed corresponding to each column of the memory cell array, each having a memory cell of a corresponding column connected thereto; memory cell selection circuitry responsive to an applied address signal for selecting a corresponding memory cell; erasing circuitry for applying an erasing voltage to a memory cell selected by the memory cell selection circuitry at the time of erase operation mode; determination circuitry for making determination whether the threshold voltage of the memory cell having the erase voltage applied is less than a predetermined value, after the application of the erase voltage; and modifying circuitry for applying a threshold modifying voltage to a memory cell verified as having a threshold voltage less than a predetermined value by the determination circuitry until the threshold voltage is greater than the predetermined value and less than a threshold voltage representing the written state.

The non-volatile semiconductor memory device according to another aspect of the present invention includes: a memory cell array having a memory cell arranged in a matrix of rows and columns, each having a floating type gate transistor for storing data representing a write state and an erase state according to the amount of accumulated charge in the floating gate; a plurality of word lines disposed corresponding to each row in the memory cell array, each having a memory cell of a corresponding row connected thereto; a plurality of bit lines disposed corresponding to each column in the memory cell array, each having a memory cell of a corresponding column connected thereto; memory cell line selection circuitry for selecting a memory cell to be programmed; determination circuitry for making determination whether the memory cell selected by the memory cell selection circuitry has a threshold voltage greater than a predetermined threshold voltage; determination data storing circuitry provided corresponding to each bit line for storing data of the determination result of the determination circuitry for a memory cell connected to a corresponding bit line; and a threshold voltage modifying circuitry responsive to the data stored in the determination data storing circuitry to apply selectively an erase voltage to a memory cell selected by the memory cell selecting circuitry for setting the threshold voltage of all the memory cells connected to the selected word line to less than the predetermined threshold voltage.

A non-volatile semiconductor memory device according to a further aspect of the present invention includes: a memory cell array having a memory cell of a floating gate type transistor arranged in a matrix of rows and columns; a plurality of word lines disposed corresponding to each row of the memory cell array, each having a memory cell of a corresponding row connected thereto; a plurality of bit lines disposed corresponding to each column of the memory cell array, each having a memory cell of a corresponding column connected thereto; erasing circuitry to apply an erase voltage to a memory cell to be programmed for setting all the memory cells to be programmed to an erased state at the time of programming mode; and data writing circuitry for writing a corresponding data into a memory cell to be programmed according to programmed data, after the erasing of a memory cell by the erasing circuitry.

A non-volatile semiconductor memory device according to still another aspect of the present invention is provided wherein the data writing circuitry of the non-volatile semiconductor device according to the further aspect includes charge injection circuitry having a charge injection efficiency to the floating gate differing at the time of writing data into a memory cell of a first logic value representing a write state and a second logic value representing an erase state.

Preferably, the charge injection efficiency is set to be lower at the time of writing a second logic value data representing an erase state than at the time of writing a first logic value data.

The non-volatile semiconductor memory device according to one aspect of the present invention has the threshold voltage modified only for a memory cell having a threshold voltage less than the predetermined threshold voltage by the modifying circuitry after the application of an erase voltage, so that the distribution range of the threshold voltage can be reduced to lower significantly the probability of memory cells of an excessive-erased state.

The non-volatile semiconductor memory device according to the another aspect of the present invention has an erase voltage applied by the modifying circuitry only for memory cells having a threshold voltage greater than the predetermined threshold voltage, so that erase voltage is not applied to a memory cell already attaining an erased state. The distribution range of the threshold voltage can be reliably reduced even if there is variation in the erase characteristics of a memory cell to lower significantly the probability of memory cells of excessive-erased state.

The non-volatile semiconductor memory device according to the further aspect of the present invention writes data according to programmed data after an erase pulse is applied to a memory cell to be programmed. Therefore, the erase operation mode consists of only a cycle applying an erase voltage pulse to reduce significantly the time required for the erase operation mode. Thus, data writing can be carried out speedily. The simultaneous writing of data "0" and "1" is equivalent to the simultaneous execution of the erase operation mode and the write operation mode, so that control is simplified greatly in comparison with the method of operation where the erase operation mode and write operation mode are carried out separately and individually.

The non-volatile semiconductor memory device according to the still another aspect of the present invention has an election injection efficiency smaller at the time of writing data "1" than at the time of writing data "0" so that injection of electrons to the floating gate is realized even for a memory cell that is excessively erased after the application of an erase voltage. Therefore, the threshold voltage attains an enhancement state and a memory cell of an excessive-erased state does not exist. Because the electron injection efficiency at the time of writing data "1" is smaller, the change in threshold voltage is small to prevent erroneous storage of data "0".

The foregoing and other objects, features, aspects and advantages of the present invention will become

BRIEF DESCRIPTION OF THE DRAWINGS

FIG. 28 is a diagram showing a third programming method of the operation flow of FIG. 23.

DESCRIPTION OF THE PREFERRED EMBODIMENTS

Figure 3:
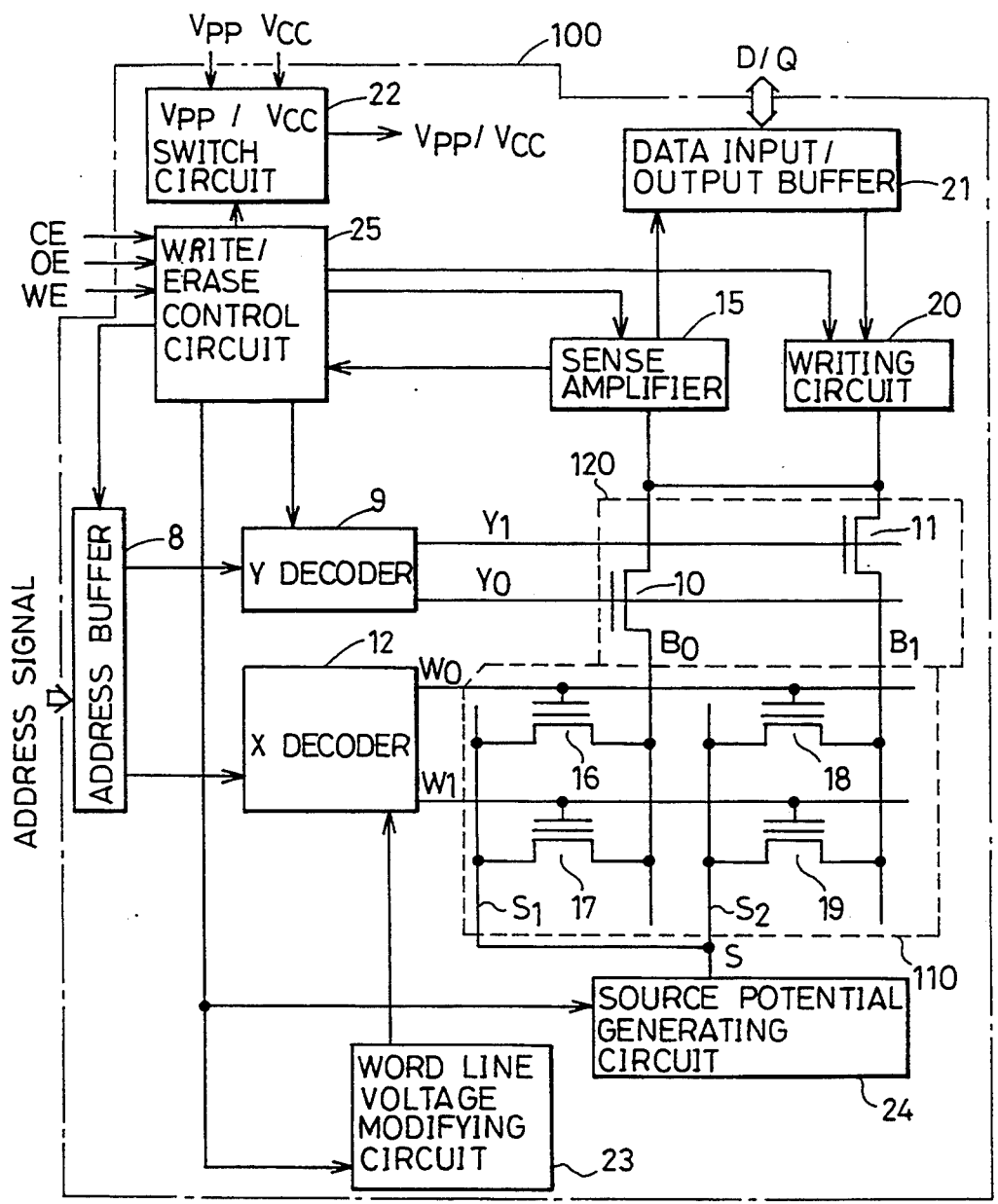
FIG. 3 is a diagram showing an entire structure of a conventional non-volatile semiconductor memory device.
Figure 10:
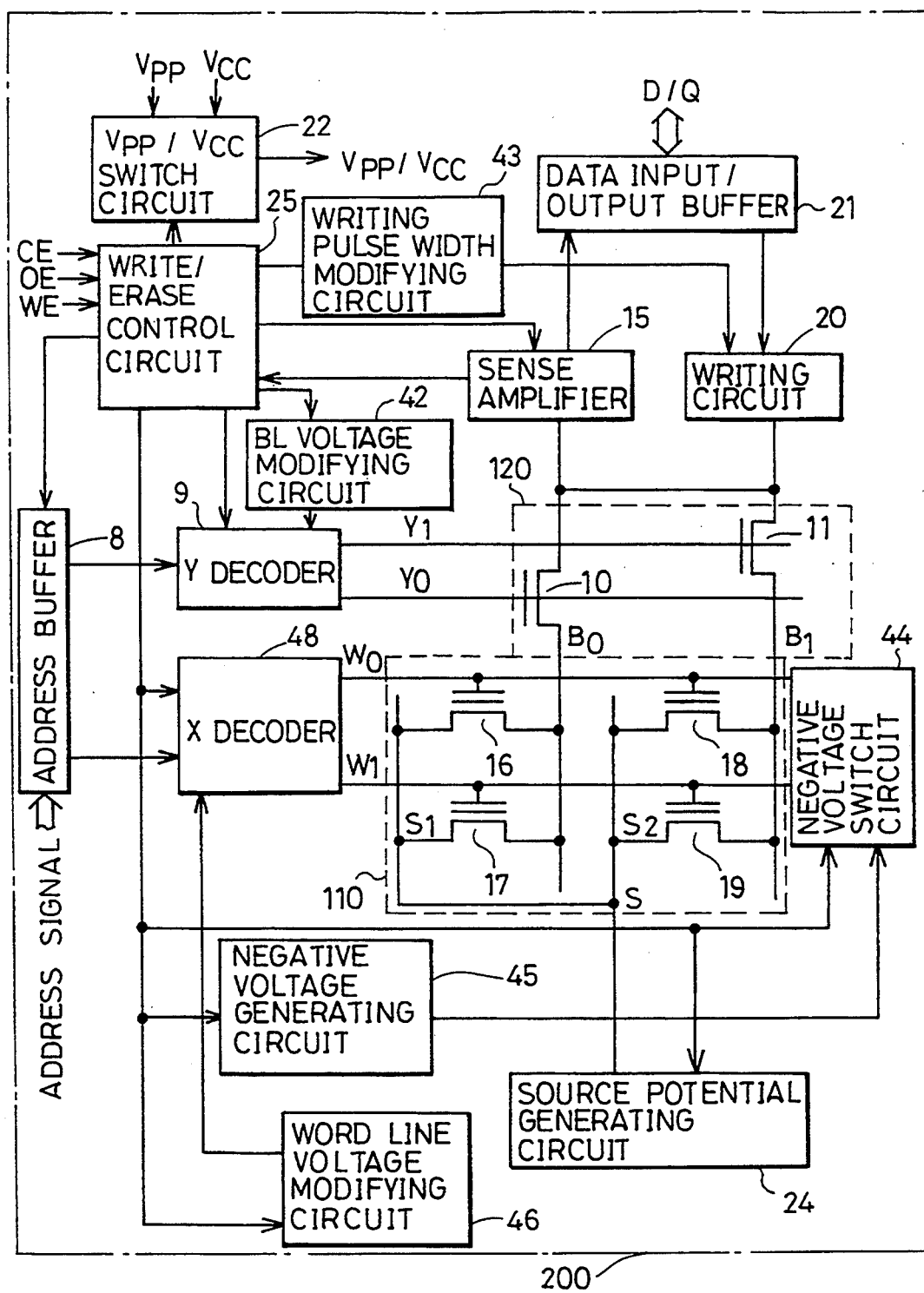
FIG. 10 is a diagram showing an entire structure of a non-volatile semiconductor memory device according to an embodiment of the present invention.

FIG. 10 shows a structure of a non-volatile semiconductor memory device (flash memory) according to an embodiment of the present invention. In FIG. 10, the components corresponding to those of the conventional flash memory shown in FIG. 3 have the same reference numerals denoted, and their description will not be repeated.

Referring to FIG. 10, a flash memory 200 according to an embodiment of the present invention includes a write pulse width modifying circuit 43 for modifying the writing pulse width to transmit the same to writing circuit 20 under the control of write/erase control circuit 25 at the time of data writing, a negative voltage switch circuit 44 for applying a negative voltage to a selected word line at the time of erase operation mode, a negative voltage generating circuit 45 for transmitting a negative voltage to negative voltage switch circuit 44, and a BL voltage modifying circuit 42 for modifying the level of the write voltage transmitted to a bit line at the time of data writing operation mode.

The other components are substantially similar to those of the conventional flash memory. However, word line voltage modifying circuit 46 includes a function to generate a voltage lower than the voltage transmitted to the word line at the time of normal writing (at the time of the operation mode where data is actually written into a memory cell after the erase operation mode) and providing the same to X decoder 48. Word line voltage modifying circuit 46 described in detail afterwards generates and provides to the X decoder a verify voltage lower than the voltage applied to the word line at the time of data reading (normal read out mode) and at the time of writing mode after erasing. At the time of normal writing and reading, a voltage of Vpp/Vcc level is applied.

Word line voltage modifying circuit 46 comprises the feature of generating at least four types of voltages of Vpp, Vcc, an erase verify voltage, and an after-erase writing voltage.

X decoder 48 sets the selected word line potential to the ground potential level at the time of erase operation mode and the non-selected word line to a high level. At the time of normal data writing and reading operation modes, X decoder 48 transmits the voltage of power supply voltage Vcc level to the selected word line. The operation thereof will be described hereinafter.

Normal writing and reading are carried out in a conventional manner. "Normal writing" refers to the operation of injecting electrons into the floating gate of a selected memory cell to write data "0" therein. "Reading" refers to the reading operation of the data of a selected memory cell via sense amplifier 15 and data input/output buffer 21. In the normal writing and reading operation, address buffer 8 receives an applied address signal to generate an internal address signal under the control of write/erase control circuit 25. The internal address signal includes an X address signal for specifying a word line of memory cell array 110, and an Y address signal for specifying a bit line. Since X decoder 48 is in the normal writing or reading operation mode, the potential of the selected word line is pulled to "H" (logical high) of voltage Vcc level and the remaining non-selected word line to "L" (logical low)of ground potential level. Y decoder 9 decodes an applied Y address signal to set column select signal Y to "H" for selecting a corresponding bit line.

The writing or reading of data is determined by output enable signal OE and write enable signal WE. At the time of data reading, output enable signal OE is active, whereby data on the bit line to which the selected memory cell is connected is transmitted to sense amplifier 15 via the Y gate transistor included in column selector gate circuit 120. Sense amplifier 15 senses whether current flows or not in that bit line to generate a relevant internal data which is provided to data input/output buffer 21. Data input/output buffer 21 responds to the applied internal read out data to generate and provide an external read out data Q.

At the time of data writing, writing circuit 20 is activated under the control of write/erase control circuit 25, and generates a writing high voltage when writing data "0". This writing high voltage is transmitted to bit line B via the Y gate transistor (10 or 11) in column selector gate circuit 120. At the time of data writing, high voltage Vpp is generated from word line voltage modifying circuit 46, whereby the potential of selected word line W (W0 or W1) attains the level of high voltage Vpp via X decoder 48. Source potential generating circuit 24 connects common source line S to ground potential under the control of write/erase control circuit 25. As a result, electrons generated by avalanche breakdown are injected into the floating gate of the selected memory cell, whereby the threshold voltage rises to allow writing of data "0".

At the time of writing data "1", a writing operation to that memory cell is not executed since writing circuit 20 generates no writing high voltage, whereby the erase state is maintained.

Figure 11:
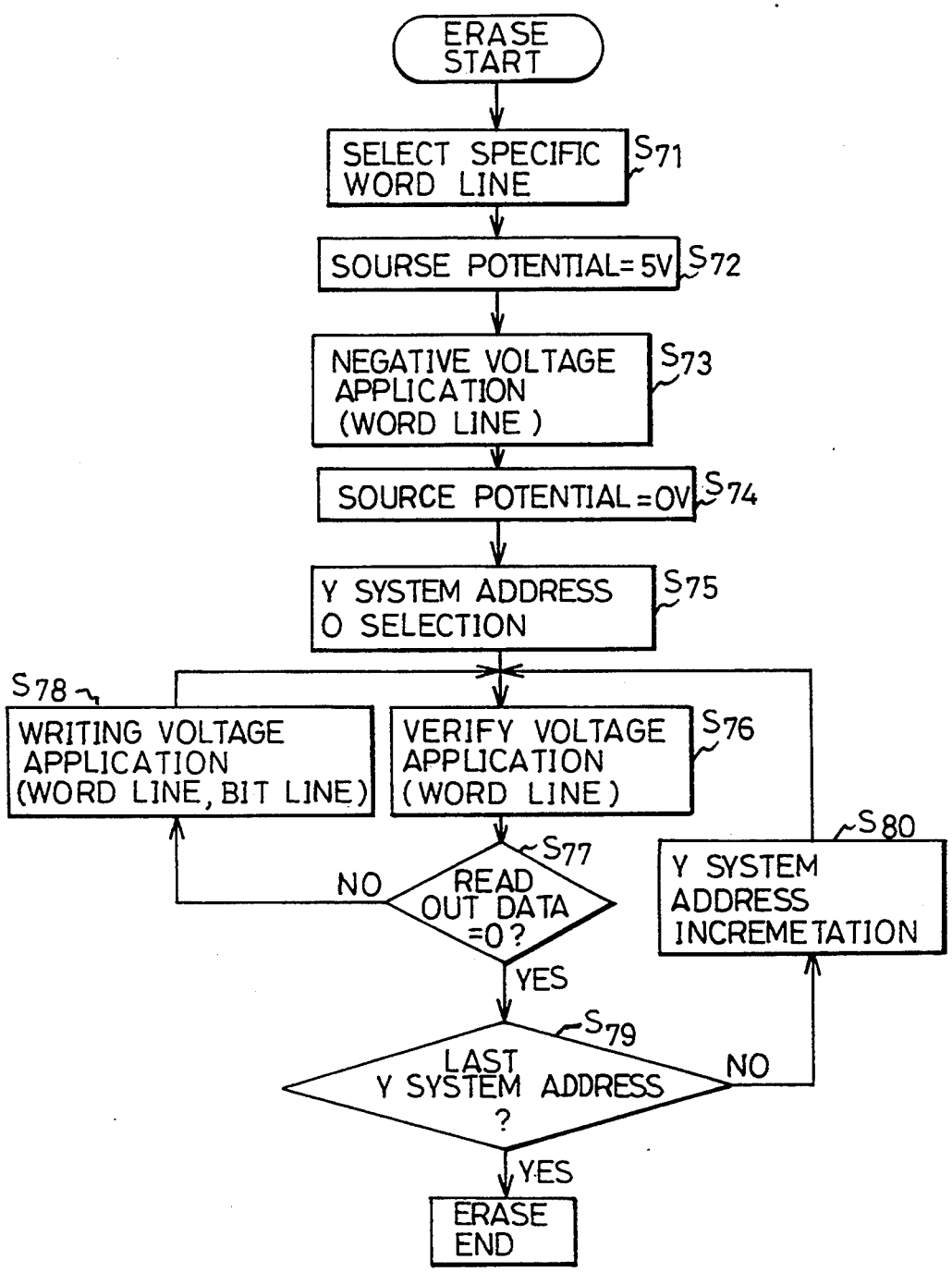
FIG. 11 is a flow chart showing the operation of the erase operation mode in the non-volatile semiconductor memory device according to an embodiment of the present invention.

The erase operation mode will be described hereinafter with reference to FIG. 11 showing an operation flow chart.

In the flash memory according to an embodiment of the present invention, the pre-erase writing operation carried out for making uniform the threshold voltage of the memory cells prior to application of an erase voltage pulse is not carried out.

At the time of erase operation mode, negative voltage generating circuit 45 is activated under the control of write/erase control circuit 25 to generate and transmit to switch circuit 44 a negative voltage of a predetermined voltage (approximately −10 V).

X decoder 48 decodes an X address signal from address buffer 8 to select a corresponding word line. X decoder 48 sets the potential of the selected word line to "L" of ground potential level and the potential of the non-selected word line to "H" under the control of write/erase control circuit 25 at the time of erase operation mode.

Negative voltage switch circuit 44 comprises a negative voltage switch provided corresponding to each word line. The negative voltage switch transmits a predetermined negative voltage (approximately −10 V) when the potential of the corresponding word line is "L". When the corresponding word line is at a potential level of "H", there is no activation and the word line potential is maintained at the H level. The operation of negative voltage switch circuit 44 is controlled by write/erase control circuit 25 (step S71).

Then, source potential generating circuit 24 transmits a voltage of power supply voltage Vcc (approximately 5 V) level onto common source line S. Y decoder 9 attains an inactive state to turn off all the Y gate transistors in column selector gate circuit 120. Thus, all the bitlines B are set to a floating state (high impedance state).

A great negative voltage of approximately −10 V is applied on the selected word line W by negative voltage switch circuit 44. A voltage of power supply voltage Vcc level is applied to source line Si by source potential generating circuit 24. This results in an application of a high voltage of approximately 15 V between the control gate and the source region of the selected memory cell to establish a tunnelling current between the floating gate and the source region, whereby the electrons of the floating gate are discharged to the source region. Thus, the threshold voltage of the selected memory cells of one row drops (steps S72 and S73).

After an erase voltage pulse is applied with a negative voltage to the selected word line and a positive voltage to the source line, the source potential is set to the ground potential level of 0 V (step S74).

With no change in the X address signal, an Y address signal indicating address 0 of a column i.e. indicating the 0-th column is applied to Y decoder 9 to select the bit line of the 0-th column (step S75). Thus, erase/verify is executed for each row.

Then, a verify voltage VT is generated from word line voltage modifying circuit 46 under the control of write/erase control circuit 25 to transmit the same on the selected word line via X decoder 48. Verify voltage VT is greater than potential voltage 0 V and sufficiently lower than the level of power supply voltage Vcc applied at the time of normal reading. Verify voltage VT may be 0V.

Sense amplifier 15 is then activated under the control of write/erase control circuit 25 to read out the data in the memory cells of the 0-th column which is transmitted to write/erase control circuit 25. Write/erase control circuit 25 determines whether the data transmitted from sense amplifier 15 is "0" or not. More specifically, determination is made whether the threshold voltage of the memory cell of the 0-th column is greater than verify voltage VT (step S77). It is to be noted that the erase voltage pulse is applied only to the memory cell connected to the selected one word line, and not to the other memory cells. Therefore, the memory cell on the same bit line connected to another non-selected word line does not attain an excessively erased state, so that there is no effect on the read out data of the memory cell of the 0-th column.

When the data of the memory cell of the 0-th column connected to the selected word line is "1", i.e. when the threshold voltage of the memory cell is lower than verify voltage VT level, a writing voltage is applied to the memory cell of the 0-th column (step S78). More specifically, writing circuit 20 is activated to apply a writing voltage to the word line and the bit line. In this case, writing pulse width modifying circuit 43 generates a writing pulse having a pulse width shorter than that provided at the time of normal writing under the control of write/erase control circuit 25 to provide the same to writing circuit 20. As a result, writing circuit 20 generates a writing pulse having a pulse width that is shorter than that of normal writing.

Bit line voltage modifying circuit 42 is activated to generate and provide to Y decoder 9 a voltage lower than that provided at the time of normal writing operation. Under this condition, the level of column select signal Y is lowered and the resistance of the Y gate transistor is increased. The Y gate transistor is a MOS transistor where a voltage having the threshold voltage subtracted from the voltage applied to the gate electrode is passed. Thus, a writing voltage lower than the voltage at the time of normal writing is transmitted on bit line B.

A voltage of a level lower than that at the time of normal writing is transmitted from word line voltage modifying circuit 46 onto the selected word line. Under this state, hot electrons caused by avalanche breakdown are injected into the floating gate in the selected memory cell.

At this time, the energy provided by the writing voltage is smaller than that provided at the time of normal writing. Therefore the number of generated hot electrons and the number of injected electrons to the floating gate are reduced in comparison with that at the time of normal writing, so that the amount in change of the threshold voltage of a memory cell is smaller than that of normal writing.

Figure 12:
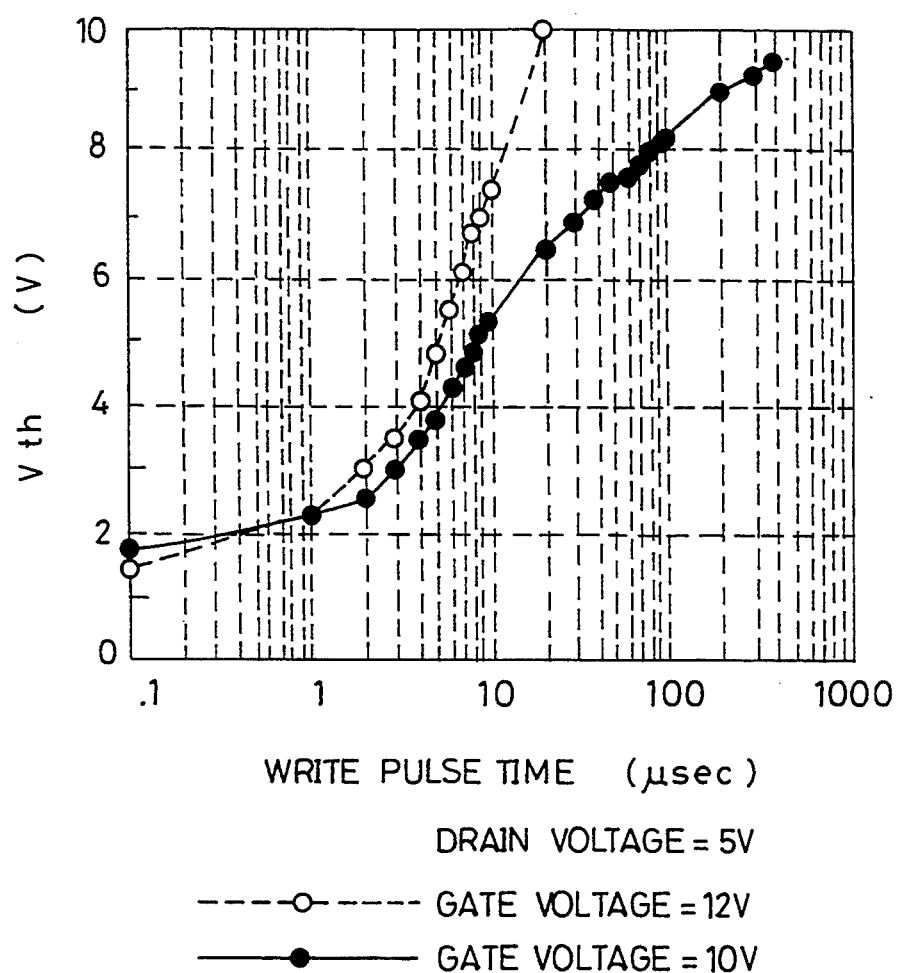
FIG. 12 is a diagram showing the writing characteristics of a flash memory cell.

The relationship between the write pulse and the amount of change of threshold voltage in a memory cell will be described hereinafter with reference to FIG. 12. Referring to FIG. 12, the abscissa represents the writing pulse application time (in the unit of microseconds), and the ordinate represents the threshold voltage of a memory cell. The curve represented by the white circle shows the change of the threshold voltage of a memory cell under the application conditions of a drain voltage of 5 V and a control gate voltage of 12 V. The curve represented by the black circle shows the change of threshold voltage under the conditions of a drain voltage of 5 V and a gate voltage of 10 V.

It can be seen from FIG. 12 that there is a threshold voltage shift of approximately 6 V at the pulse width (writing pulse time) of 10 microseconds when writing is carried out under the conditions of a drain voltage of 5 V and a control gate voltage of 12 V. There is a threshold voltage shift of approximately 1 V with a writing pulse width of 1 microsecond under the same application conditions. A memory cell is used having a threshold voltage of approximately 1 V in the state where no writing pulse is applied.

Therefore, the amount of change in threshold voltage in a memory cell can be reduced by decreasing the writing pulse width by writing pulse width modifying circuit 43 to be shorter than that at the time of normal writing to gradually raise the threshold voltage.

It can be appreciated from FIG. 12 that the amount of change of threshold voltage can be reduced in the region where the writing pulse width is greater than 1 $\mu$s (microseconds) when the control gate voltage is lowered to 10 V from 12 V. This means that the threshold voltage of the memory cell can gradually be raised at the time of after-erase writing by lowering the control gate voltage.

The verify operation is carried out with a small amount of change in threshold voltage as described above, and the after-erase writing into a memory cell is carried out until the threshold voltage of the memory cell exceeds verify voltage VT. When the readout data is "0" under the condition of the potential of the word line taking verify voltage VT, determination is made whether the current Y address is the last address or not (step S79). If the address is not the last address, the Y address is incremented by 1 (step S80), and control returns to step S76.

This operation is carried out for all the memory cells connected to the selected word line, and the above-described after-erase writing operation is carried out only for a memory cell connected to the selected word line having a threshold voltage that is lower than verify voltage VT. Thus, the threshold voltage of all the memory cells connected to the selected word line becomes higher than verify voltage VT.

Figure 13:
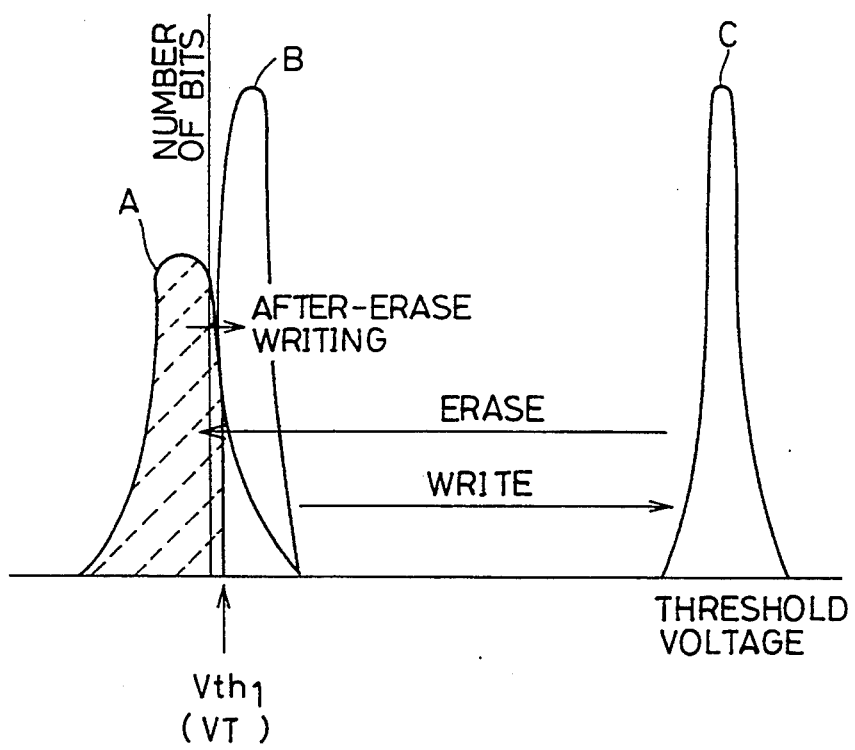
FIG. 13 is a diagram showing a distribution of a threshold voltage of a memory cell after the execution of erase operation in the non-volatile semiconductor memory device of FIG. 10.

As a result, the threshold voltage of the memory cell widely distributed as shown in curve A due to variation in erasing characteristics of each memory cell when erase voltage is applied after the word line selection, is gradually raised to result in a threshold voltage distributed in a narrow region as shown in curve B of FIG. 13.

For example, if threshold voltage Vth1 is set as the verify voltage VT, after-erase writing is carried out for a memory cell having a threshold voltage lower than threshold voltage Vth1. This means that the distribution of the threshold voltage of the memory cell shown by curve A is shifted to the threshold voltage distribution shown by curve B. In this case, there may be some memory cells in the vicinity of threshold voltage Vth1 which have a threshold voltage slightly lower than threshold voltage Vth1. However, at the time of normal data reading where word line potential is 0 V, the ON resistance is very high so that only a negligible amount of source/drain current flows. There is no possibility of data "0" being erroneously read out as data "1", and erroneous read out of data caused by an excessively erased memory cell is prevented.

The advantage of erasing on a word line by word line basis or on a sector unit will be described in more detail.

Upon erasing, only a word line or a sector is selected, and the other word lines are non-selected. When a first word line is selected, for erasing, the memory cells connected to the first selected word line are subjected to application of an erase pulse or voltage. The memory cells on non-selected word lines are not subjected to the application of erasing pulse, so that these memory cells on non-selected word lines do no enter the excessively erased state. Thus, determination on whether a memory cell on the first select word line is in an excessively erased state can be surely made. This operation is repeated until the last word line. As for an intermediately selected word line between the first and the last selected word lines, the previously selected memory cells have their threshold voltages adjusted and are not in the excessively erased state. Thus, detection of the threshold voltages of the memory cells on the intermediately selected word line can be reliably made, resulting in reliable adjustment of the threshold voltages of the memory cells.

In a conventional flash memory, all the memory cells are subjected to the erasing pulse application at a time. Thus, there is great possibility that an excessively erased memory cell lies on the same bit line as that a memory cell under detection of the threshold voltage lies on, resulting in an erroneous determination of the threshold voltage. The scheme of the present invention is more advantageous than such flash erasing scheme.

With the structure of applying negative voltage to a selected word line at the time of erase operation mode as described above, only a voltage of the power supply voltage Vcc level is required to be applied to the source region. Because a high voltage Vpp is not applied to the source region, hot electrons will not be generated in the source region. Only electron discharge from the floating gate caused by tunneling current is carried out. The damage of a gate insulation film caused by hot holes can be suppressed to increase the lifetime of the flash memory. It is known that the damage of a gate insulation film caused by hot holes is greater than that caused by hot electrons.

The aforementioned negative voltage which will be described in details afterward is applied only to the selected word line. Because the drive load capacitance is low, a negative charge can easily be generated by a charge pump circuit using a capacitor. This structure also allows the generation of a high voltage Vpp internally by a charge pump operation. High voltage Vpp can be generated easily by a charge pump circuit using a capacitor since it is required to be applied only to a selected word line. A high voltage Vpp and a negative voltage can easily be generated by an operating power supply voltage Vcc of approximately 5 V with a minimum area to provide a flash memory of a 5 V only power supply.

In the structure shown in FIG. 10, bit line voltage modifying circuit 42, word line voltage modifying circuit 46, and write pulse width modifying circuit 43 may be driven simultaneously, or Just one may be driven selectively. A combined operation of these circuits allows critical control of the amount of change in threshold voltage in the after-erase writing operation.

The erase operation cycle shown in the flow chart of FIG. 11 may be implemented within a chip in a hardware manner. The erase operation cycle can be implemented easily with a hardware having a structure of a control circuit where the cycle is initiated when chip enable signal CE and write enable signal WE are both activated to execute sequentially a desired operation. Write/erase control circuit 25 may be implemented with a microprocessor to be programmed to execute the flow chart shown in FIG. 11.

The specific structure and operation of each circuit will be described in details hereinafter.

Figure 14:
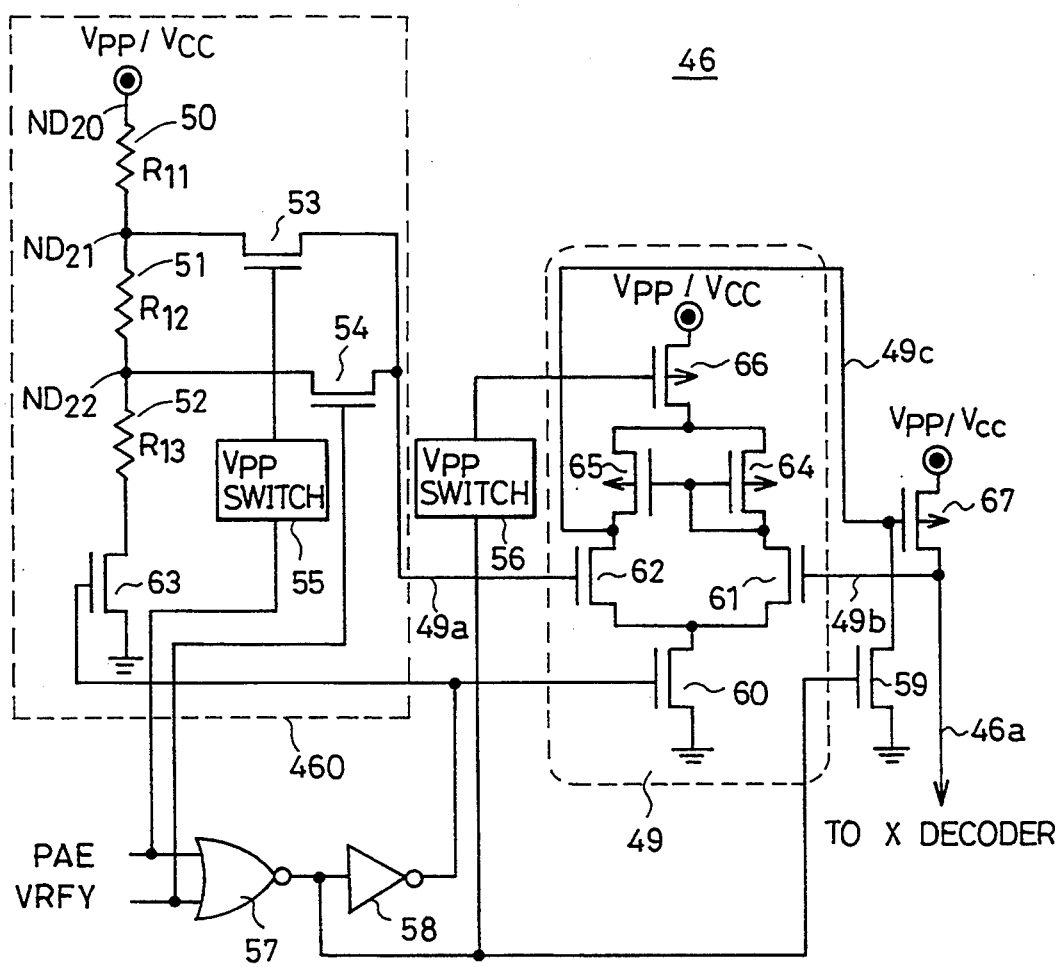
FIG. 14 is a diagram specifically showing the word line voltage modifying circuit of FIG. 10.

FIG. 14 specifically shows a structure of the word line voltage modifying circuit of FIG. 10. Referring to FIG. 14, word line voltage modifying circuit 46 includes an NOR circuit 57 for receiving an after-erase write signal PAE and a verify signal VRFY indicating that mode is the verify operation mode, and a voltage generator 460 responsive to after-erase write signal PAE and verify signal VRFY to generate selectively a desired word line driving voltage. After-erase write signal PAE and verify signal VRFY are provided from write/erase control circuit 25 shown in FIG. 10. NOR circuit 57 generates a signal of a H level only when both after-erase write signal PAE and verify signal VRFY attain a L level.

Voltage generator 460 includes resistors 50, 51 and 52 connected in series between node ND20 receiving voltage Vpp/Vcc and ground potential, and an n channel MOS transistor 63. Resistors 50, 51 and 52 have a resistance of R11, R12, and R13, respectively. The gate of transistor 63 receives the output of NOR circuit 57 via an inverter circuit 58.

Voltage generator 460 further includes a Vpp switch 55 responsive to after-erase write signal PAE for selectively generating voltage Vpp/Vcc, an n channel MOS transistor 53 responsive to the output of Vpp switch 55 for transmitting the voltage on node ND21 to signal line 49a, and an n channel MOS transistor 54 responsive to verify signal VRFY for transmitting the voltage on node ND22 to signal line 49a.

Figure 5:
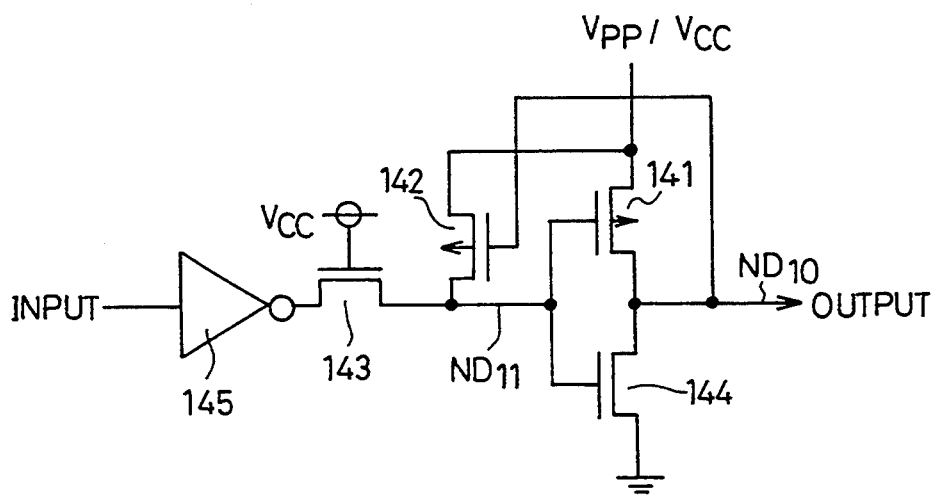
FIG. 5 specifically shows a structure of the Vpp switch of FIG. 4.
Figure 6:
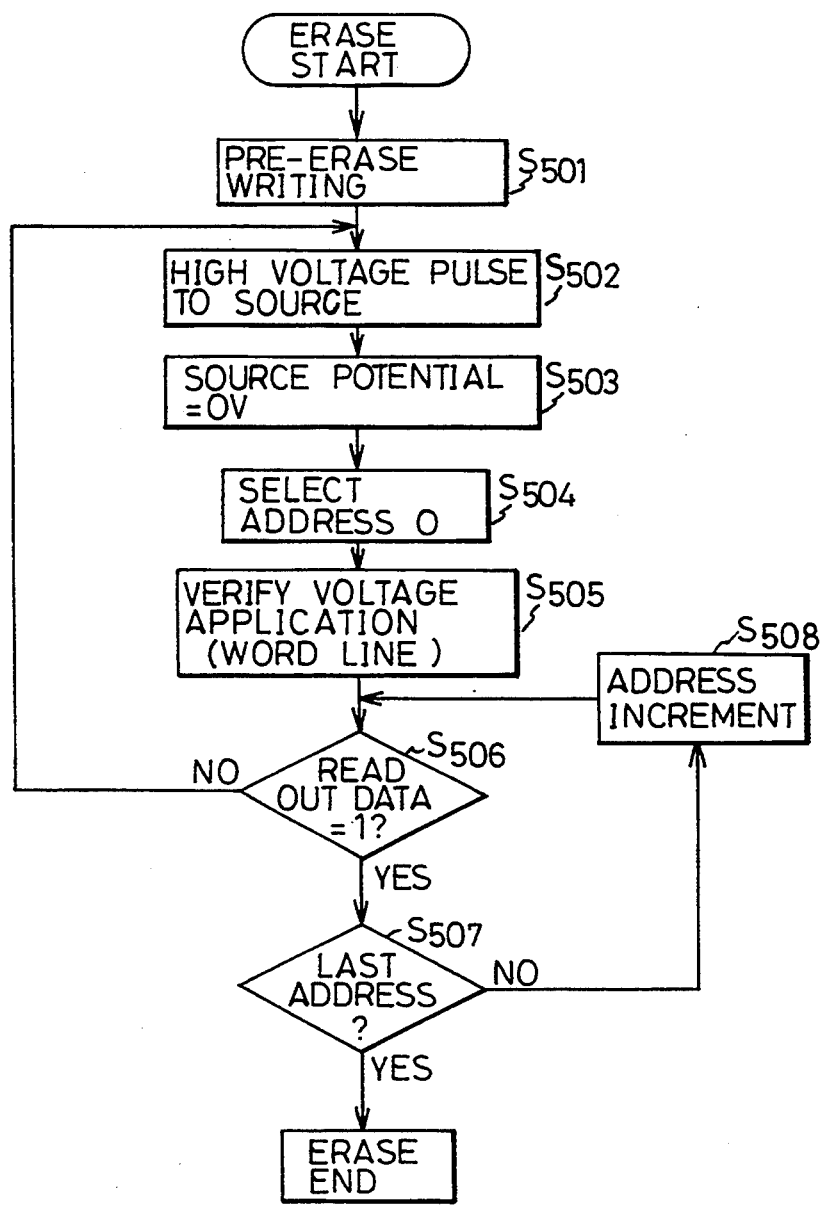
FIG. 6 is a flow chart showing an erase operation mode in a conventional non-volatile semiconductor memory device.
Figure 7:
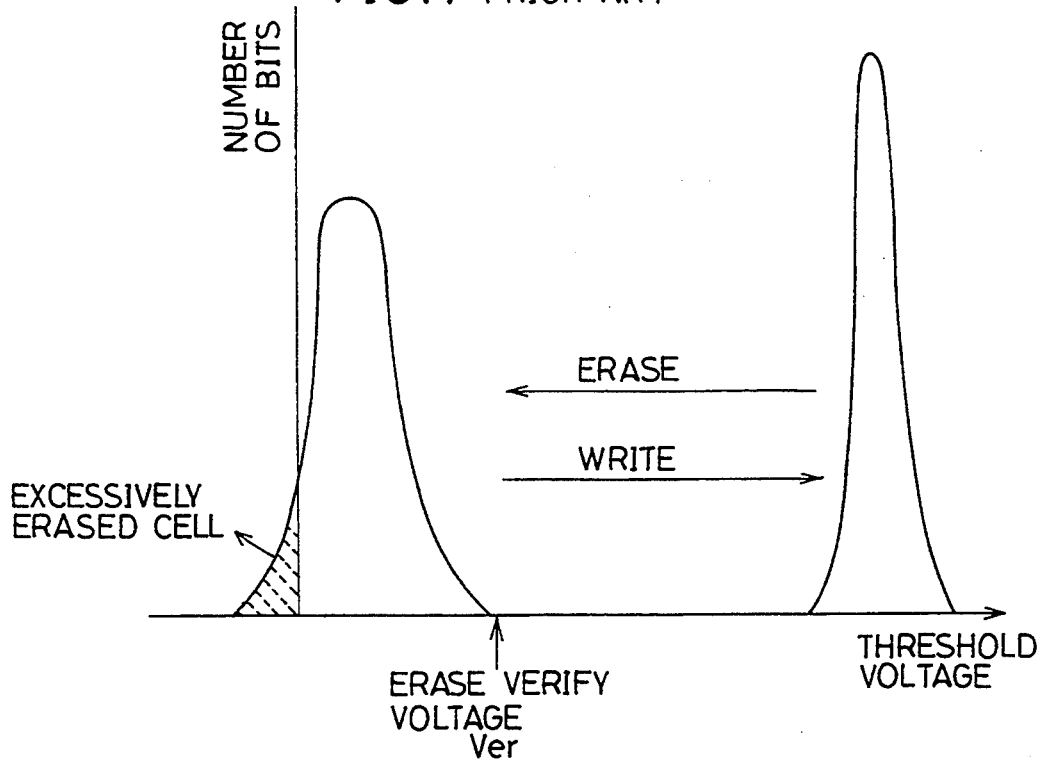
FIG. 7 is a diagram showing the distribution of threshold voltage in a memory cell of a conventional non-volatile semiconductor memory device.
Figure 8:
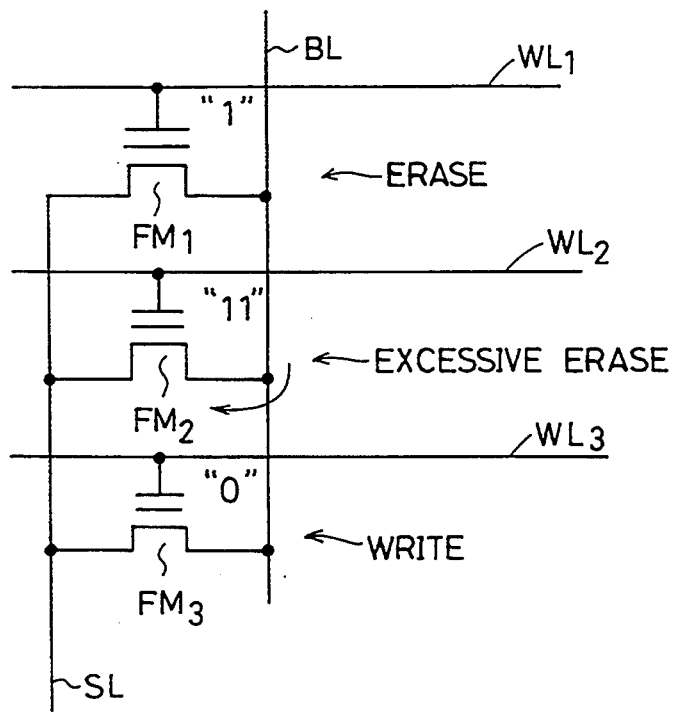
FIG. 8 is a diagram for describing the problem of an excessively-erased memory cell.
Figure 9:
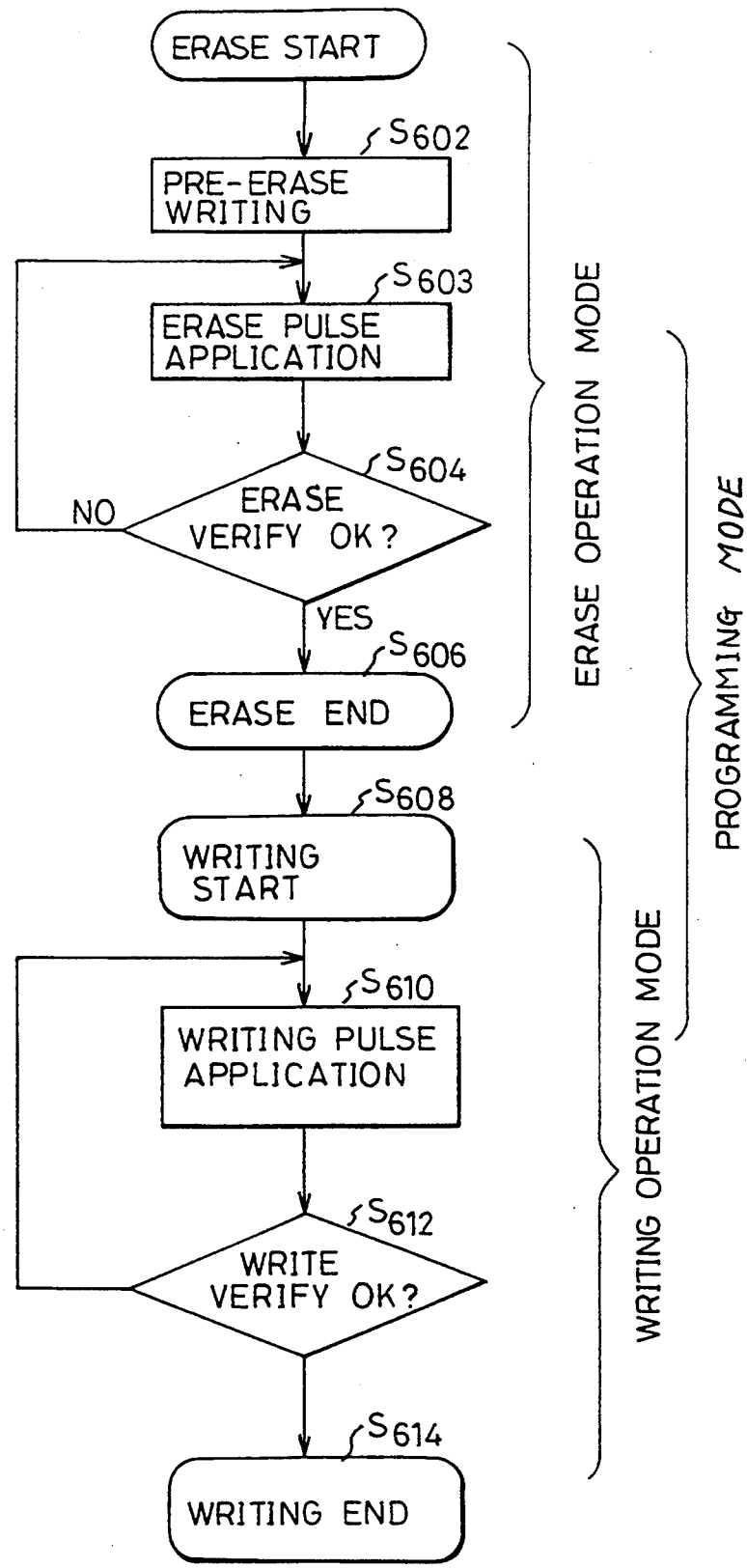
FIG. 9 is a flow chart showing a programming mode of a conventional non-volatile semiconductor memory device.

Vpp switch 55 serves to selectively pass the voltage of high voltage Vpp according to a H signal of 5 V level. Vpp switch 55 has a structure similar to that of the switch shown in FIG. 5. More specifically, Vpp switch 55 generates voltage. Vpp/Vcc when after-erase write signal PAE is active at H. Voltage Vpp/Vcc generated by Vpp switch 55 is the same Vpp/Vcc voltage applied to node ND20. Voltage Vpp or Vcc is applied to node ND20 according to the operation mode. In general, voltage Vcc is applied at the time of reading and erasing, otherwise Vpp is applied.

Word line voltage modifying circuit 46 further includes a comparison circuit 49 activated in response to the output of inverter circuit 58 for comparing the output voltage of voltage generator 460 provided on signal line 49a and the word line driving signal voltage on signal line 49, a Vpp switch 56 responsive to the output of NOR circuit 57 for generating voltage Vpp/Vcc, a p channel MOS transistor 67 responsive to the signal on output signal line 49c of comparison circuit 49 for providing voltage Vpp/Vcc to signal line 46a, and an n channel MOS transistor 59 responsive to the output of NOR circuit 57 for resetting the level of the output signal line 49c to ground potential.

Vpp switch 56 has a structure similar to that of Vpp switch 55. Vpp switch 56 generates and provides to comparison circuit 49 voltage Vpp/Vcc to set comparison circuit 49 to an operating state. The voltage on signal line 46a is provide, to X decoder 48.

Figure 4:
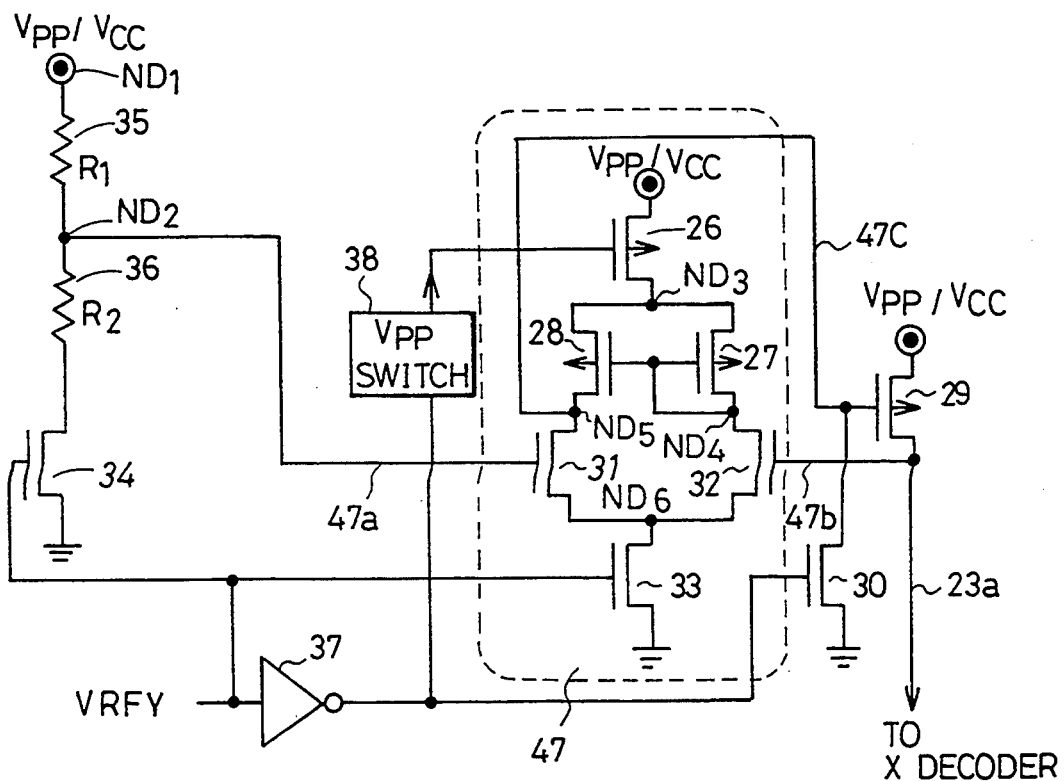
FIG. 4 specifically shows a structure of the word line voltage modifying circuit of FIG. 3.

Comparison circuit 49 has a structure similar to that of comparison circuit 47 shown in FIG. 4. Comparison circuit 49 includes a p channel MOS transistor 66 acting as a voltage applying source to receive the output signal of Vpp switch 56 at its gate, p channel MOS transistors 64 and 65 having voltage applied from transistor 66 and forming a current mirror circuit, and n channel MOS transistor 62 for receiving the signal on signal line 49a at its gate, an n channel MOS transistor 61 for receiving the signal on signal line 49b at its gate, and an n channel MOS transistor 60 receiving the output of inverter circuit 58 at its gate to provide a current path for transistors 61 and 62. The operation of comparison circuit 49 is similar to that of comparison circuit 47 of FIG. 4. Comparison circuit 49 serves to equalize the signal potential on signal line 49a and the signal potential on signal line 49b, i.e. signal line 46a when active. The operation of word line voltage modifying circuit 46 will be described hereinafter.

(i) Verify operation

After word line selection, an erase voltage pulse is applied to the memory cell connected to the selected word line. After an erase voltage pulse is applied, determination is made whether the threshold voltage of the memory cell connected to the selected word line is below verify voltage VT. At the time of verify operation, verify signal VRFY attains a H level and after-erase write signal PAE attains a L level.

Here, the output of Vpp switch 55 is L (refer to FIG. 5) so that transistor 53 is OFF. Transistor 54 responds to verify signal VRFY to be turned on, whereby node ND22 is connected to signal line 49a. NOR circuit 57 is responsive to a H level verify signal VRFY to output a signal of L level. In response, inverter circuit 58 provides an H signal. This brings transistor 59 to an OFF state, and transistors 60 and 63 to an ON state. Vpp switch 56 responds to a L signal from NOR circuit 57 to provide a L signal.

As a result, comparison circuit 49 is activated to compare the signal potential on signal line 49a and the signal potential on signal line 49b. The signal potential on node ND22 is transmitted to signal line 49a. Since transistor 63 attains an ON state, a voltage appears in node ND22 which is voltage Vpp/Vcc provided to node ND20 (Vcc) resistor-divided by a ratio of R13: (R11+R12). Therefore, comparison circuit 49 (refer to FIG. 4) functions to generate to signal line 49b, i.e. to signal line 46a, a verify voltage VT which is voltage Vpp/Vcc divided by resistance (R11+R12) and resistance R13. This verify voltage VT is transmitted to the X decoder (VT<<Vcc).

(ii) After-erase writing operation

An after-erase writing operation is executed for a memory cell which is determined as having a threshold voltage lower than verify voltage VT by the verify operation. At this time, after-erase write signal PAE attains a H level. Verify signal VRFY attains a L level. The output of Vpp switch 55 is voltage Vpp/Vcc (Vpp). Transistor 53 is turned on and transistor 54 is turned off. After-erase write signal PAE of a H level causes transistors 60 and 63 to be turned on and transistor 54 is turned off. Transistor 66 is turned on by Vpp switch 56.

At the time of after-erase writing operation, the voltage generated at node ND21 is transmitted to signal line 49a. The voltage appearing on node ND21 is voltage Vpp/Vcc (Vpp) resistor-divided by resistance R11 and resistance (R12+R13). The after-erase writing voltage Vew appearing at the time of after-erase writing is greater than verify voltage VT. According to after-erase writing voltage Vew on signal line 49a, comparison circuit 49 generates after-erase writing voltage Vew to signal lines 49b and 46a. As a result, an after-erase writing voltage Vew lower than high voltage Vpp is applied from the X decoder to the selected word line.

(iii) Normal writing and normal reading

In writing data "0" into a memory cell or reading out data in a memory cell after the erase operation mode, after-erase write signal PAE and verify signal VRFY both brought to the L level. In this state, transistors 53 and 54 are both turned off. NOR circuit 57 generates a H signal since the two inputs are L. Transistor 59 is turned on, and transistors 60 and 63 are turned off by an L signal from inverter circuit 58. Transistor 66 is turned off since voltage Vpp/Vcc is applied to the gate via Vpp switch 56. Under this state, the potential of signal line 49c attains the L level of ground potential, and transistor 67 transmits voltage Vpp/Vcc to signal line 46. At the time of normal reading mode, voltage Vcc is provided to the X decoder. At the time of normal writing mode, voltage Vpp is transmitted to the X decoder.

As described above, voltage Vpp/Vcc, after-erase writing voltage Vew, and verify voltage VT are selectively generated according to after-erase write signal PAE and verify signal VRFY. After-erase writing voltage Vew is lower than the voltage of normal writing mode. Verify voltage VT is lower than voltage Vcc and after-erase writing voltage Vew of normal reading mode.

After data writing, a write verify cycle is carried out for determining whether the written data is correct or not. A structure may be employed in which voltage generating circuit 460 further generates another write verify voltage when the level of the write verify voltage applied to the word line differs from that of verify voltage VT. This structure can easily be implemented by adding one resistor to the resistor-dividing circuit. Alternatively, a structure may be employed where operating power supply voltage Vcc applied at the time of normal reading is raised and generated using a capacitor at the time of writing verify operation.

Verify voltage VT takes a value that is not less than ground potential, and that is lower than the threshold voltage indicating a write state of a memory cell after after-erase writing.

With the above-described structure, the level of the voltage transmitted to the word line at the time of after-erase writing operation can be lowered to reduce the amount of variation of the threshold voltage of a memory cell, resulting in a narrow distribution range of threshold voltage of a memory cell.

Figure 15:
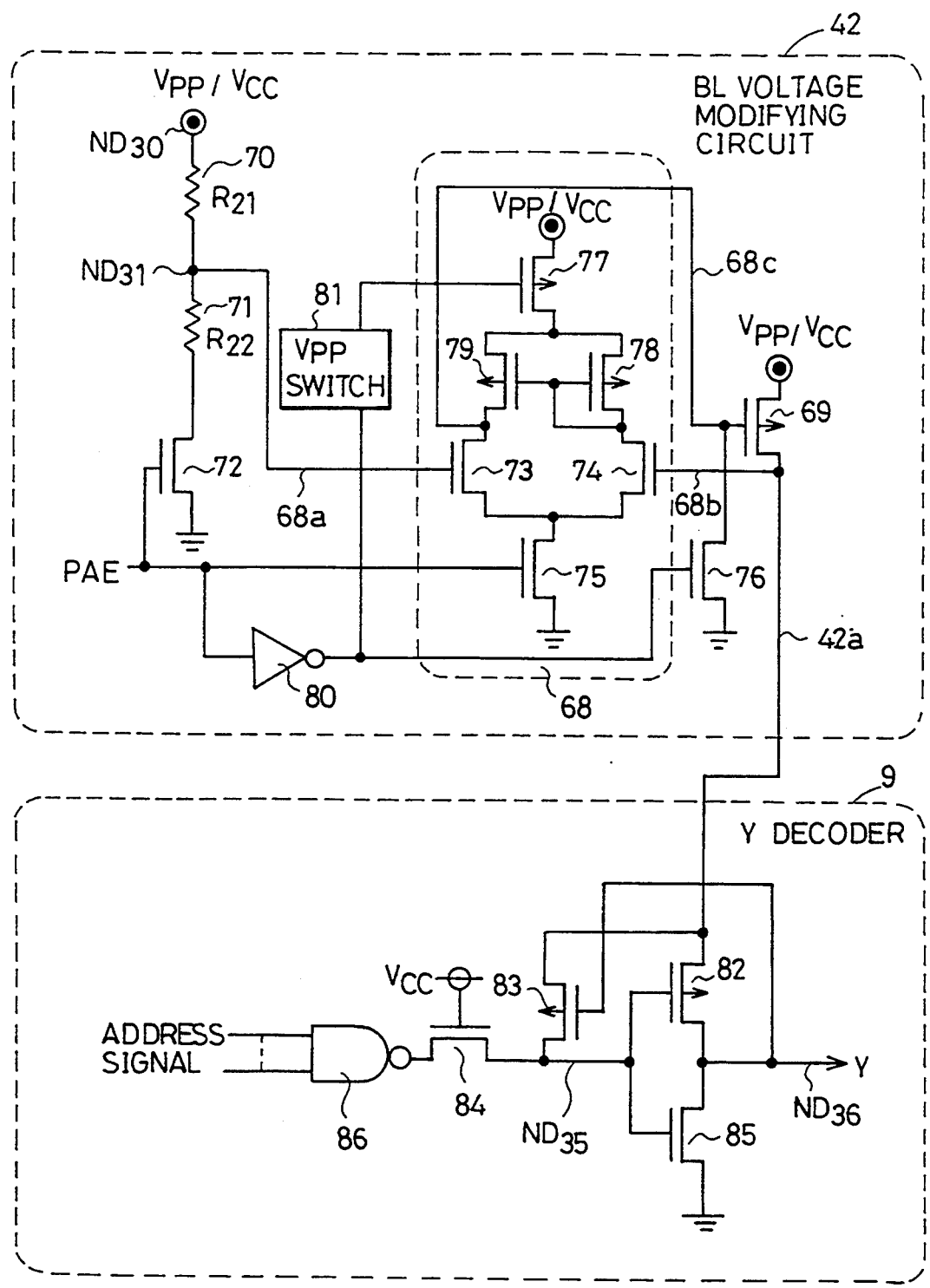
FIG. 15 is a diagram specifically showing the bit line voltage modifying circuit and the Y decoder of FIG. 10.

FIG. 15 shows a specific structure of the bit line voltage modifying circuit and the Y decoder of FIG. 10. Referring to FIG. 15, bit line voltage modifying circuit (BL voltage modifying circuit) 42 includes resistors 70 and 71 connected in series between node ND30 receiving voltage Vpp/Vcc and ground potential, and an n channel MOS transistor 72. Resistors 70 and 71 have a resistance of R21 and R22, respectively. The gate of transistor 72 receives after-erase write signal PAE. Node ND31 connecting resistors 70 and 71 is connected to signal line 68a. When after-erase write signal PAE attains a H level, a voltage which is voltage Vpp/Vcc (Vpp) resistor-divided by resistances R21 and R22 appears on node ND31.

Bit line voltage modifying circuit 42 further includes an inverter circuit 80 for receiving after-erase write signal PAE, a Vpp switch 81 responsive to the output of inverter circuit 80 to be actuated for generating voltage Vpp/Vcc, a comparison circuit 68 activated in response to after-erase write signal PAE and the output of Vpp switch 81 for comparing the signal potential on signal line 68a with that on signal line 68b, a p channel MOS transistor 69 responsive to the signal on signal line 68c transmitting an output signal of comparison circuit 68 for selectively passing voltage Vpp/Vcc, and an n channel MOS transistor 76 responsive to the output of inverter circuit 80 for resetting signal line 68c to the level of ground potential. The output voltage of transistor 69 is provided to Y decoder 9 via signal line 42a.

Comparison circuit 68 has a structure similar to that of comparison circuit 47 of FIG. 4 and that of comparison circuit 49 of FIG. 14. Specifically, comparison circuit 68 includes a p channel MOS transistor 77 for receiving the output of Vpp switch 81 at its gate, p channel MOS transistors 78 and 79 forming a current mirror type circuit to operate with the voltage applied via transistor 77 as the power supply voltage, n channel MOS transistors 73 and 74 for implementing differential amplifier means for comparing the signals on signal lines 68a and 68b, and an n channel MOS transistor 75 turned on in response to after-erase write signal PAE to provide a current path for transistors 73 and 74.

Comparison circuit 68 is active when after-erase write signal PAE is H to amplify differentially the signal potential on signal line 68a and the signal potential on signal line 68b to provide the differential amplified result to signal line 68c. The resistance of transistor 69 depends on the signal potential of signal line 68c. The output voltage of transistor 69 is applied to signal line 68b. Comparison circuit 68 acts to set the signal potential of signal line 68a to be identical to the signal potential of signal line 68b at the time of operation.

When after-erase write signal PAE is at a L level, comparison circuit 68 attains an inactive state (transistors 77 and 75 both turned off), whereby signal line 68c is set to the level of ground potential by transistor 76. As a result, transistor 69 transmits voltage Vpp/Vcc to signal line 42a.

Y decoder 9 includes a unit decoder provided corresponding to each Y gate transistor. The unit decoder includes an NAND type decode circuit 86 for receiving a predetermined combination of address signals, and n channel MOS transistor 84 to receive power supply voltage Vcc at its gate to pass the output of decode circuit 86 for functioning as a protective resistor, a p channel MOS transistor 82 and an n channel MOS transistor 85 complementary-connected between signal line 42a and ground potential to receive the voltage transmitted via transistor 84, and a p channel MOS transistor 83 responsive to the signal potential on node, ND36 for transmitting the signal potential on signal line 42a to node ND35. Transistor 83 is provided to stabilize the potential of node ND36. Transistor 84 functions to prevent the destruction of the output transistor of NAND type decode circuit 86 when the signal potential of node ND35 attains a high voltage Vpp.

NAND type decode circuit 86 provides a L signal when the applied predetermined combination of address signals all attain a H level. In response to "L" of node ND35, transistor 85 is turned off and transistor 82 is turned on. Thus, the signal potential on signal line 42a is transmitted to node ND36. In response to the signal potential of node ND36, transistor 83 is turned off, whereby the potential of node ND35 is maintained at the L level by NAND type decode circuit 86.

When decode circuit 86 is at a non-selected state (at least one bit of the applied address signal attains a L level), the output of decoder circuit 86 attains a H level to turn on transistor 85 and turn off transistor 82. As a result, the potential level of node ND36 attains a L level. The potential level of node ND36 is transmitted to the gate of transistor 83. Transistor 83 is turned on, and the potential level of node ND35 is brought to the potential level of signal line 42a to ensure the off state of transistor 82. Column select signal Y is generated from node ND36 to be transmitted to the gate of a corresponding Y gate transistor. The operation of bit line voltage modification by bit line voltage modifying circuit 42 and Y decoder 9 will be described hereinafter.

(i) After-erase writing operation

At the time of after-erase writing operation, after-erase write signal PAE attains a H level. In this state, comparison circuit 68 is activated, whereby voltage Vpp/Vcc (Vpp) applied on signal line 68a is resistor-divided by resistances R21 and R22 to be provided to signal line 42a.

An L signal is provided from select decode circuit 86. This causes a voltage to be transmitted to node ND36 via transistor 82 which is voltage Vpp/Vcc resistor-divided by resistances R21 and R22. Here, the voltage has a level lower than voltage Vpp/Vcc appearing at node ND36 at the time Of normal writing (Vpp appears since a writing high voltage is transmitted at the time of normal writing). As a result, the gate voltage of the Y gate transistor is lower than that at the time of normal writing, so that the signal potential transmitted to a corresponding bit line via a Y gate transistor is lowered even if a writing high voltage is generated from writing circuit 20. The level of the voltage transmitted to the bit line depends on the voltage level applied to that gate and the threshold voltage of the Y gate transistor. The level of the bit line voltage can be adjusted to an appropriate level by resistances R21 and R22 of resistors 70 and 71.

(ii) Normal reading mode, normal writing mode and verify mode

Under this state, after-erase write signal PAE attains a L level. Therefore, voltage Vpp/Vcc is transmitted to signal line 42a according to the operation mode. The signal potential on signal line 42a is transmitted to output node ND36 of the select decode circuit. The potential level of column select signal Y attains the level of voltage Vpp/Vcc (Vcc, Vpp, Vpp; respectively, for each mode).

The implementation of voltage Vpp/Vcc may be carried out where high voltage Vpp is generated at the time of normal writing and after-erase writing operation, and voltage Vcc generated at the time of erase verify operation and normal reading operation. A structure may be employed where high voltage Vpp is generated at the time of write verify mode if a voltage higher than Vcc is applied to the word line at the time of write verify operation (the cycle determining whether the written data after the data writing operation is correct or not).

Figure 16:
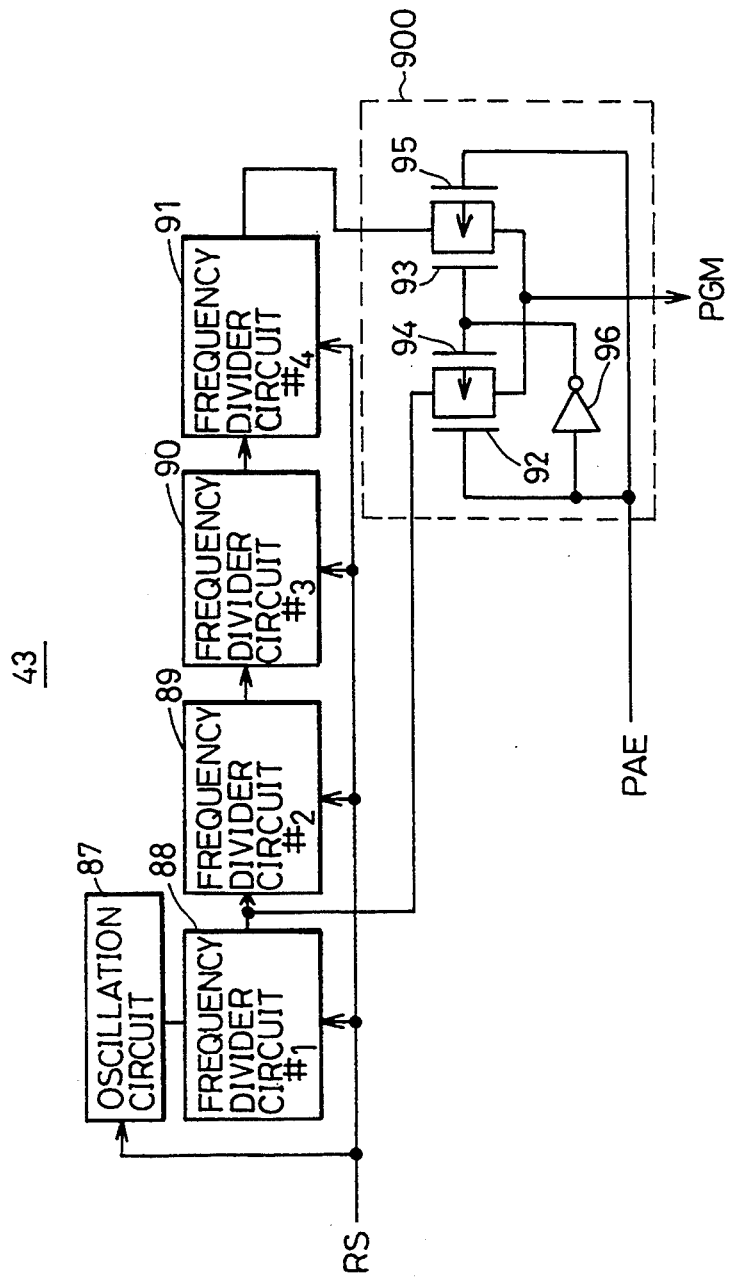
FIG. 16 is a diagram specifically showing a structure of the write pulse width modifying circuit of FIG. 10.

FIG. 16 specifically shows a structure of write pulse width modifying circuit 43 of FIG. 10. Referring to FIG. 16, write pulse width modifying circuit 43 includes an oscillation circuit 87 for providing an oscillation signal of a predetermined period, a frequency divider circuit 88 for frequency-dividing the oscillation signal from oscillation circuit 87 by a frequency division ratio of #1, a frequency divider circuit 89 for frequency-dividing the output signal of frequency divider circuit 88 by a frequency division ratio of #2, a frequency divider circuit 90 for frequency-dividing the output signal of frequency divider circuit 89 by a frequency division ratio of #3, a frequency divider circuit 91 for frequency-dividing the output of frequency divider circuit 90 by a frequency division ratio of #4, and a selection gate 900 responsive to after-erase write signal PAE for selectively passing the output signal of frequency divider circuit 88 or frequency divider circuit 91. A write pulse signal PGM is generated from selection circuit 900 to be provided to writing circuit 20. Writing circuit 20 responds to write pulse signal PGM to generate a writing high voltage for a time period defined by write pulse signal PGM in writing data "0".

Selection circuit 900 includes an n channel MOS transistor 92 and a p channel MOS transistor 94 forming one CMOS transmission gate, and an n channel MOS transistor 93 and a p channel MOS transistor 95 forming the other CMOS transmission gate. After-erase write signal PAE is applied to the gates of transistors 92 and 95. After-erase write signal PAE is provided to the gates of transistors 94 and 93 via inverter circuit 96.

A reset signal RS is supplied to oscillation circuit 87 and frequency divider circuits 88-91. A pulse signal with a sequentially longer period is generated from frequency divider circuits 88-91. More specifically, the period of the pulse signal provided from frequency divider circuit 88 is shorter than that provided from frequency divider circuit 91. The width of the output pulse of frequency divider circuit 88 is smaller than that of frequency divider circuit 91. The operation thereof will be described hereinafter.

When reset signal RS is active, oscillation circuit 87 does not carry out oscillation operation and frequency divider circuits 88-91 maintain the reset state. A pulse signal is not provided under this state.

At the time of writing, reset signal RS becomes inactive, whereby oscillation circuit 87 and frequency divider circuit 88-91 operates to provide a signal having a predetermined pulse width.

At the time of normal writing operation, after-erase write signal PAE attains a L level, whereby transistors 93 and 95 are turned on, and transistors 92 and 94 are turned off. Selection circuit 900 selects an output pulse signal from frequency divider circuit 91 to provide the same as write pulse signal. PGM to writing circuit 20.

At the time of after-erase writing operation, after-erase write signal PAE attains a H level, whereby transistors 92 and 94 are turned on, and transistors 93 and 95 are turned off. Under this state, selection circuit 900 selects an output pulse signal of frequency divider circuit 88 to provide the same as write pulse signal PGM to writing circuit 20. The width of the output pulse signal of frequency divider circuit 88 is smaller than that of the output signal of frequency divider circuit 91. Thus, writing is carried out only for a short time period in after-erase writing operation, so that the amount of variation of the threshold voltage of a memory cell can be decreased than that at the time of normal writing.

Write pulse width modifying circuit 43 frequency-divides the output of oscillation circuit 47 using a frequency divider circuit. An implementation for modifying the writing pulse width can be achieved using a fall delay circuit instead of a frequency divider circuit for delaying only the fall of the pulse signal from oscillation circuit 87.

At the time of erase voltage pulse application, the potential of the selected word line is set to a negative voltage, and a voltage of approximately 5 V is applied to the source line, as described above. This reduces the applied electric field to the source region to prevent damage (caused by hot holes) of a gate insulation film. The structure for applying a negative voltage to a selected word line at the time of erase voltage pulse application will be described hereinafter.

Figure 1:
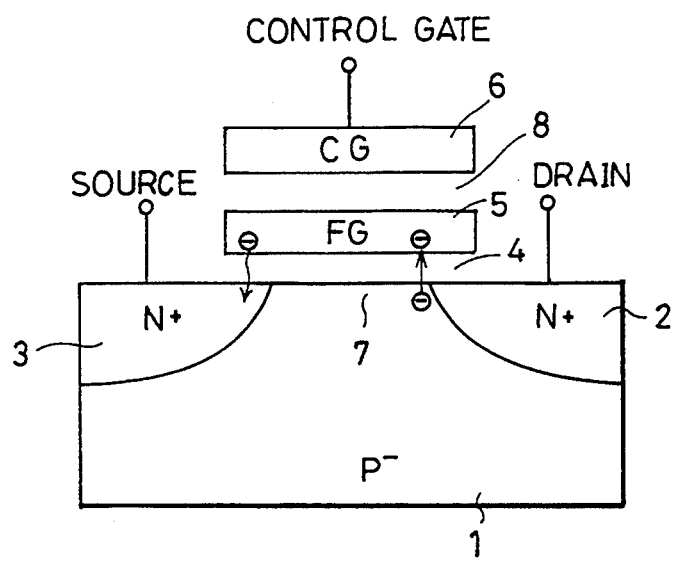
FIG. 1 is a sectional structure view of a conventional flash memory cell.
Figure 2:
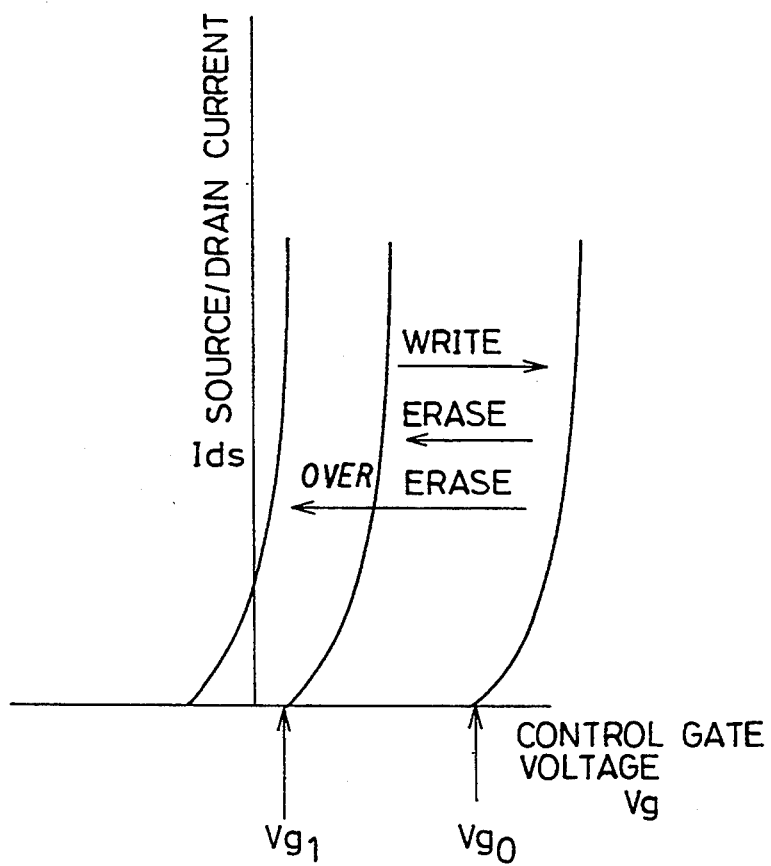
FIG. 2 is a diagram showing the change in threshold voltage at the time of a write state and an erased state of the flash memory cell of FIG. 1.
Figure 17:
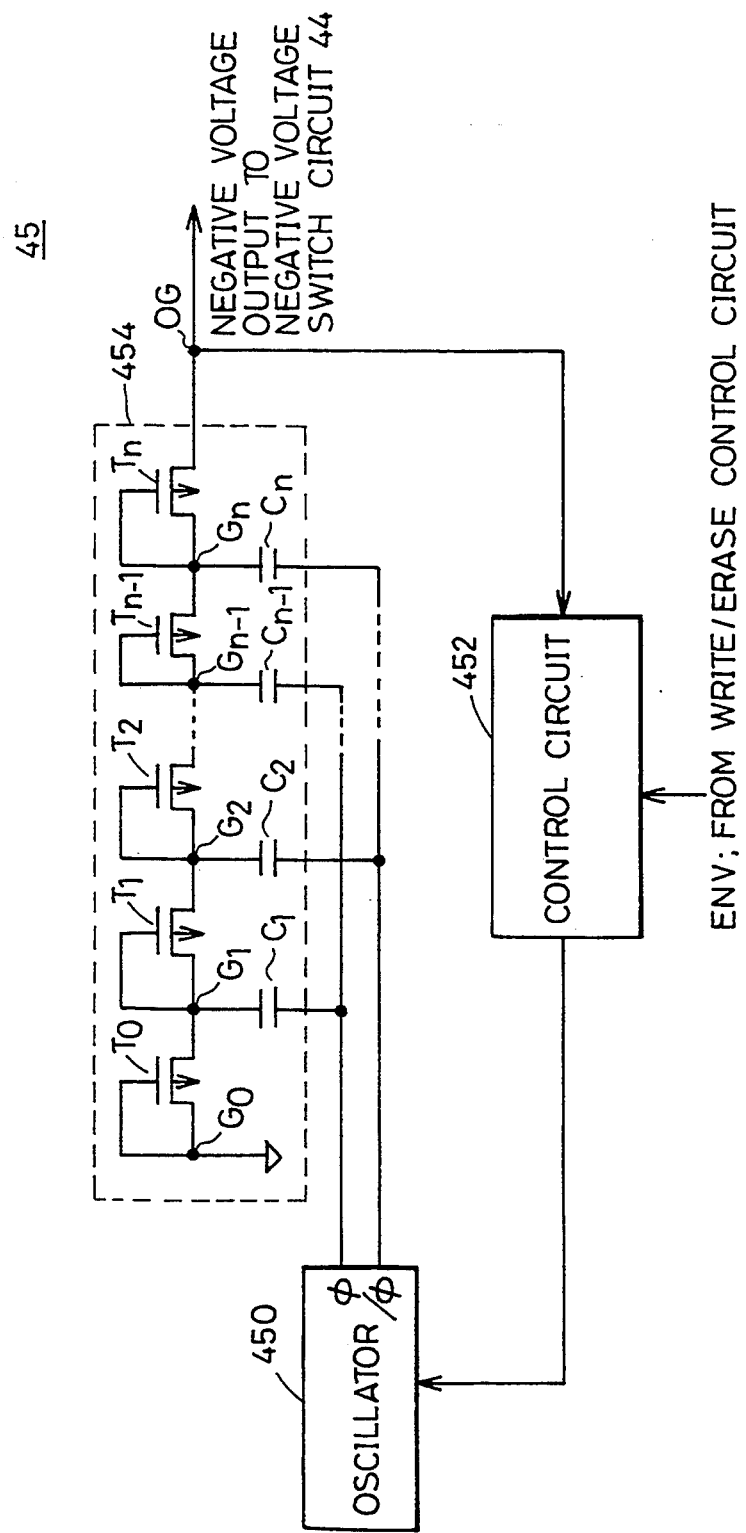
FIG. 17 is a diagram showing a specific structure of the negative voltage generating circuit of FIG. 10.

FIG. 17 shows a specific structure of negative voltage generating circuit 45 of FIG. 1. Referring to FIG. 17, negative voltage generating circuit 45 includes an oscillator 450 for generating two-phase clock signals $\phi$ and $\bar{\phi}$ having a predetermined period, a charge pump circuit 454 responsive to the two-phase clock signals $\phi$ and $\bar{\phi}$ from oscillator 450 for carrying out charge pump operation to generate a negative voltage, and a control circuit 452 responsive to a negative voltage generating instructing signal ENV from write/erase control circuit 25 to activate oscillator 450. Control circuit 452 comprises a negative voltage monitor function to monitor a negative voltage provided from charge pump circuit 454 to stop the operation of oscillator 450 when the provided negative voltage becomes lower than a predetermined level for providing a stable negative voltage of a predetermined level (approximately −10 V). The structure of a level detection circuit for detecting whether the negative voltage reaches a predetermined level or not is well known in the art.

Charge pump circuit 454 includes p channel MOS transistors T0-Tn connected in series between ground potential and output node OG, each having its diode connected; and capacitors C1-Cn for lowering the potentials of connection nodes G1-Gn by charge pumping operation. Transistors T0-Tn are equivalent to diodes connected in a forward direction between output node 0G and ground potential. Capacitors C1, C3 ... C (2i+1) are provided with a clock signal $\phi$ from oscillator 450. Capacitors C2, ... C(2i) ... Cn have a complementary clock signal $\bar{\phi}$ supplied from oscillator 450. The operation thereof will be described hereinafter.

The generation of negative voltage generation instructing signal ENV at the time of erase operation mode actuates control circuit 452 to generate two-phase clock signals $\phi$ and $\bar{\phi}$ from oscillator 450.

When clock signal $\phi$ attains a H level, the potentials of nodes G1, G3, ... Gn−1 rise by the capacity coupling of capacitors C1, C3, ... Cn−1. This turns on transistors T0, T2, ... Tn−2 so that the potential of each of nodes G2−Gn-1 attain a level corresponding to the potential of the preceding node.

The fall of clock signal $\phi$ to a L level causes the potential of nodes G1, G3, ... Gn−1 to drop, whereby transistor T0 is turned off and transistors T2, T4, and Tn−2 are turned off.

When clock signal $\bar{\phi}$ attains a H level, the potentials of nodes G2, G4, ... Gn rise to turn on transistors T1, T3, ... Tn−1, whereby the potential of the preceding node is transmitted to the relative nodes. When clock signal $\bar{\phi}$ falls to a L level, transistors T1, T3, ... Tn−1 are turned off and transistor Tn is turned on, whereby output node 0G attains a potential level corresponding to node Gn.

By repeating the above-described operation, the potential of each of nodes G-Gn are sequentially lowered. The charge in each of nodes G1-Gn is transmitted to the relative preceding nodes of G0-Gn−1 and charge is drawn from output node OG for every period of clock signals $\phi$ and $\bar{\phi}$. In other words, electrons are injected into output node OG to lower the potential of output node OG. Charge pump circuit 454 eventually generates and provides to output node OG a negative voltage where the potential difference of each of nodes G0-Gn become the threshold voltage Vth of the transistor. Thus, a negative voltage appears at output node OG which is determined by the product of the number of stages of transistors T0-Tn and the threshold voltage. A typical negative voltage is in the level of approximately −10 V.

Control circuit 452 detects the level of the negative voltage of output node OG to stop the oscillation operation of oscillation circuit 450 when a predetermined level is reached, so that charge pump operation is inhibited out to generate a negative voltage of a constant level.

Figure 18:
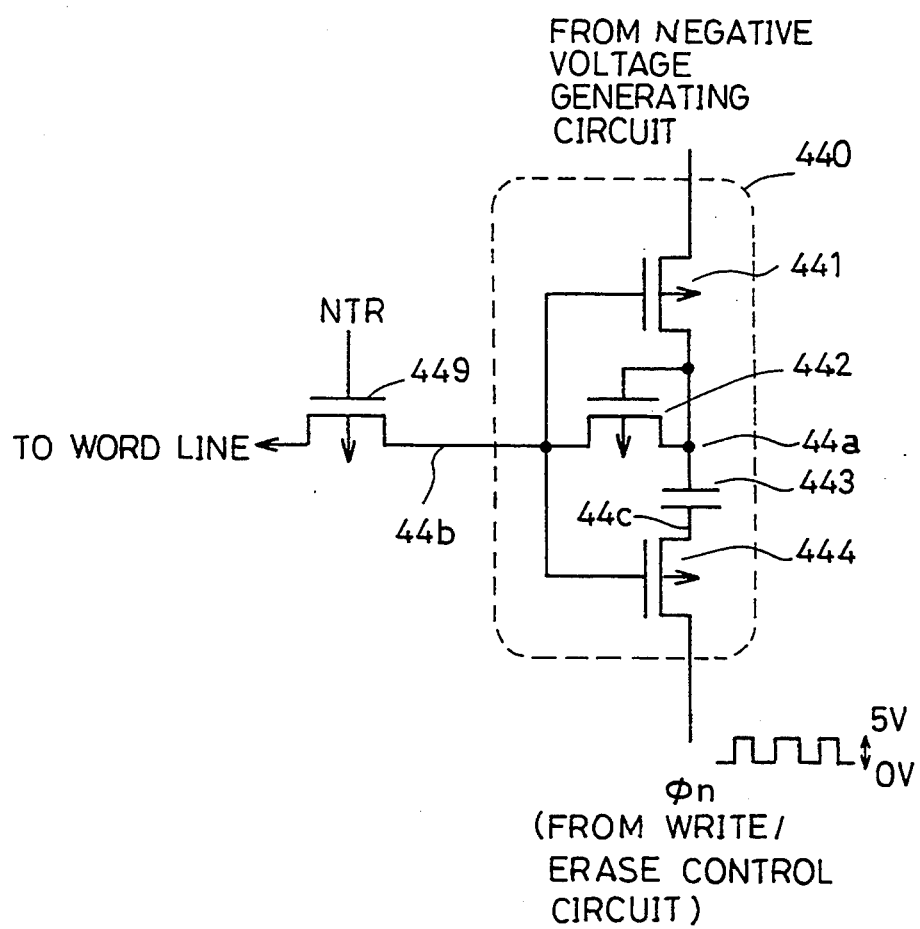
FIG. 18 is a diagram specifically showing a negative voltage switch included in the negative voltage switch circuit of FIG. 10.

FIG. 18 shows a specific structure of a negative voltage switch 440 included in negative voltage switch circuit 44 of FIG. 10. Negative voltage switch 440 is provided corresponding to each word line. Referring to FIG. 18, negative voltage switch 440 includes a p channel MOS transistor 441 responsive to a signal potential of output node 44b for transmitting a negative voltage from negative voltage generating circuit 45 to node 44a, a p channel MOS transistor 442 having the diode connected between node 44a and output node 44b, a capacitor 443 provided between node 44a and node 44c, and a p channel MOS transistor 444 responsive to a signal potential on output node 44b four transmitting selectively clock signal φn to node 44c.

Transistor 442 is diode-connected in a forward direction from node 44b to node 44a, whereby a clock signal n is generated from write/erase control circuit 25 only at the time of erase operation mode. Transistor 442 is set to an electrically floating state (a high impedance state) or at ground potential at modes other than the erase operation mode.

A p channel MOS transistor 449 is provided between a corresponding word line and output node 44b responsive to negative voltage propagation signal NTR generated from write/erase control circuit 25 at the time of erase operation mode to be turned on. Negative voltage propagation signal NTR is a signal having a voltage level substantially equal to the negative voltage generated from negative voltage generating circuit 45. The operation will be described hereinafter.

At the time of erase operation, negative voltage propagation signal NTR of a negative potential level is generated to turn on transistor 449, whereby the potential on a corresponding word line is transmitted to negative voltage output node 44b.

It is assumed that the potential of a corresponding word line is 0 V of ground potential. At this time, a voltage of ground potential level is applied to the gates of transistors 441 and 444 via node 44b. As a result, transistor 444 is turned on to transmit clock signal φn to node 44c.

When clock signal φn rises from the L level of 0 V to a high level of 5 V of power supply voltage Vcc, the potential of node 44a rises by the capacity coupling of capacitor 443. Here, the positive charge injected into node 44a is discharged to negative voltage generating circuit 45 via transistor 441 since transistor 441 receives a signal of ground potential at its gate and a negative voltage (approximately −10 V) from negative voltage generating circuit 45 at its other conduction terminal. Therefore, the potential of node 44a can rise only to the level of the sum of the potential of node 44b and threshold voltage Vthp of transistor 441, i.e. 0 V+Vthp<1 V.

When clock signal φn falls from an H level to an L level, charge is drawn from node 44a by the capacity coupling of capacitor 443, whereby the potential of node 44a drops. In response to the drop of potential of node 44a, transistor 442 is turned on so that the potential of node 44a is transmitted to node 44b. The potential of negative voltage output node 44b and the potential of node 44a are values determined by the parasitic capacitance taking the parasitic capacitance of a corresponding word line as the main component element and the ,capacitance of capacitor 443. Here, nodes 44b and 44a attain at least a negative potential.

Then, when clock signal φn attains a H level, the potential of node 44a rises again by the capacity coupling of capacitor 443. Here, the potential of node 44b is negative and transistor 441 is ON. Therefore, the potential of node 44a can rise only to a potential level of a sum of the potential of negative voltage output node 44b and the threshold voltage of transistor 441. Transistor 442 is turned off since the potential of node 44a is higher than that of node 44b, so that the potential of negative voltage output node 44b does not change.

Then, when clock signal φn falls to a L level, the potential of node 44a drops again, whereby the dropped potential is transmitted to negative voltage output node 44b.

By repeating the above-described operation, the potentials of node 44a and negative voltage output node 44b are sequentially lowered. The potential of negative voltage output node 44b eventually is lowered to a voltage level of the sum of the negative voltage provided from negative voltage generating circuit 45 and threshold voltage Vthp of transistor 441. Negative voltage propagation signal NTR is a signal having a level substantially equal to that of the negative voltage generated from negative voltage generating circuit 45. The negative voltage on node 44b is transmitted to a corresponding word line, whereby the potential of the corresponding word line attains a negative voltage.

When the potential of a corresponding word line attains a H level of power supply voltage Vcc, transistors 441 and 444 are turned off since their gates are provided with signals of power supply voltage Vcc level. Because the potential of node 44a does not change under this state, the potential of negative voltage output node 44b maintains the potential transmitted from a corresponding word line.

When the potential of a corresponding word line is at a level of ground potential, the level of that word line can be set to a negative voltage, as described above. If the potential of the selected word line is a L level of ground potential by the X decoder, and the potential of the non-selected word line is a H level of power supply voltage Vcc at the time of applying an erase voltage pulse, negative voltage can be applied only to the selected word line, so that the erase voltage pulse is applied only to a memory cell connected to the selected word line. The structure of modifying the potential of the selected word line according to the operation mode will be described hereinafter.

Figure 19:
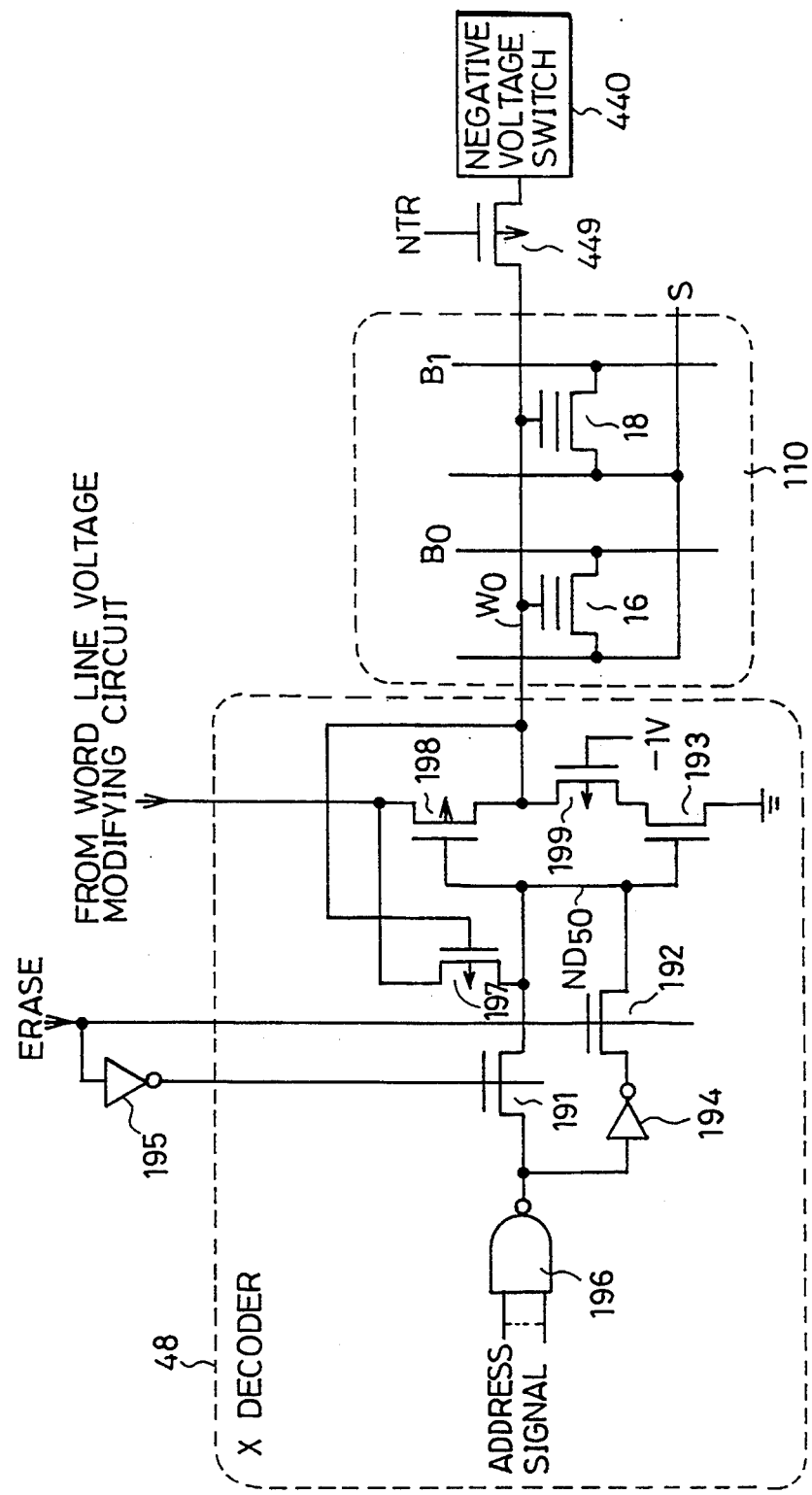
FIG. 19 is a diagram showing a specific structure of the X decoder of FIG. 10.

FIG. 19 shows a specific structure of X decoder 48 of FIG. 10. The components associated with word line W0 of memory cell array 110 are indicated in FIG. 19. X decoder 48 includes an NAND type decode circuit 196 for receiving a predetermined combination of address signals (X address signal), and n channel MOS transistor 191 receiving an erase signal ERASE generated at the time of erase operation via an inverter circuit 195 at its gate to selectively transfer the output of decode circuit 196 to node ND50, an inverter circuit 194 for inverting the output of decode circuit 196, and n channel MOS transistor 192 responsive to erase signal ERASE for transmitting selectively the output of inverter circuit 194 to node NT50, a p channel MOS transistor 198 responsive to the signal potential on node ND50 for selectively transmitting to word line W0 the word line driving signal from word line voltage modifying circuit 46, and n channel MOS transistor 193 responsive to the signal potential on node ND50 for setting word line W0 to ground potential, a p channel MOS transistor 199 for disconnecting transistor 193 from word line W0 at the time of applying negative voltage to word line W0, and a p channel MOS transistor 197 for stabilization responsive to the signal potential on word line W0 for setting the potential of node ND50 to the level of the word line driving signal from word line voltage modifying circuit 46. A negative voltage of approximately −1 V is applied to the gate of transistor 199. This negative voltage of −1 V may be a negative voltage from negative voltage generating circuit 45, or may be applied from another circuit. The operation thereof will be described hereinafter.

At the time of erase operation, i.e. at the time of applying an erase voltage pulse, erase signal ERASE attains a H level. Under this state, transistor 191 is turned off and transistor 192 is turned on. It is assumed that the combination of address signals applied to decode circuit 196 all attain an H level, and word line W0 is selected. Under this state, the output of NAND type decode circuit 196 attains a L level, and the potential of node ND50 attains a H level via inverter circuit 192. As a result, transistor 198 is turned off, and transistor 193 is turned on. Transistor 199 is turned on since a negative voltage of approximately −1 V is applied to the gate. The potential of word line W0 attains a L level of ground potential.

The ground potential level on word line W0 is applied to the gate of transistor 197 to turn on transistor 197. Voltage Vpp/Vcc (in this case voltage Vcc) from word line voltage modifying circuit 46 is applied to node ND50, so that the potential level of word line W0 is maintained at the level of ground potential.

At the time of erase operation, negative voltage propagation signal NTR is generated to turn on transistor 449, whereby word line W0 is connected to negative potential switch 440. As described before in association with FIG. 18, negative potential switch 440 is driven when the potential of the word line attains a level of ground potential, so that the potential of word line W0 attains a negative potential via negative potential switch 440 (here, negative voltage propagation signal NTR is a signal having a level substantially equal to the negative voltage generated from negative voltage generating circuit 45).

When the potential of word line W0 attains a negative potential, transistor 199 is turned off since its gate potential becomes higher than the source potential. As a result, transistor 193 and word line W0 are disconnected so that word line W0 is fixed to a negative potential.

When word line W0 is non-selected, the output of decode circuit 196 attains a H level, and the potential of node ND50 attains a L level. Under this state, transistor 198 is turned on and transistor 193 is turned off. The potential of word line W0 attains a level of the voltage (Vcc level) provided from word line voltage modifying circuit 46. Therefore, negative voltage switch 440 does not operate even when negative voltage propagation signal NTR is generated, and the potential of word line W0 attains a H level.

Erase signal ERASE attains a L level in modes other than the erase operation mode (i.e. other than the operation mode of applying an erase voltage pulse). Under this state, transistor 191 is turned on and transistor 192 is turned off. Therefore, when word line W0 is selected, the output of DECODE circuit 196 attains a L level, and the potential level of node ND50 attains a L level via transistor 191. Therefore, the potential of the selected word line W0 attains the level of the voltage applied from word line voltage modifying circuit 46 via transistor 198. Negative voltage propagation signal NTR is not generated in modes besides the erase operation mode, and word line W0 and negative voltage switch 440 are disconnected.

By employing an X decoder of the above-described structure, the selected word line can be set to a negative voltage and the non-selected word line to a H level only at the time of applying an erase voltage pulse, and the selected word line can be set to the output voltage level of word line voltage modifying circuit 46 and the non-selected word line to the level of ground potential at modes other than the erase voltage pulse application mode.

When an X decoder of the above-described structure is used, a voltage of Vcc (5 V) level is applied only to source line S at the time of erase voltage pulse application. Because application of high voltage Vpp is not required for the source region, damage of the gate insulation film caused by application of high voltage Vpp is eliminated to increase the lifetime of the flash memory.

The driving load of the negative voltage transmitted to only the selected word line is low. A negative voltage of a sufficient level, can be applied to a word line with a negative voltage generating circuit of a significantly small drive capability. A negative voltage can easily be generated with a small occupying area. High voltage Vpp is only transmitted to the word line at the time of writing operation, so that high voltage Vpp can be generated from power supply voltage Vcc using a charge pump circuit occupying a small area. Thus, a flash memory that operates with a single kind of power source of 5 V is obtained.

In the above described embodiment, threshold voltage gradually rises by carrying out after-erase writing to a memory cell having a threshold voltage lower than a predetermined threshold voltage VT, after applying an erase voltage pulse. A method can be taken of gradually decreasing the threshold voltage of a memory cell having a threshold voltage greater than a predetermined threshold voltage as one method of reducing the distribution range of threshold voltage. This method will be described hereinafter.

Figure 20:
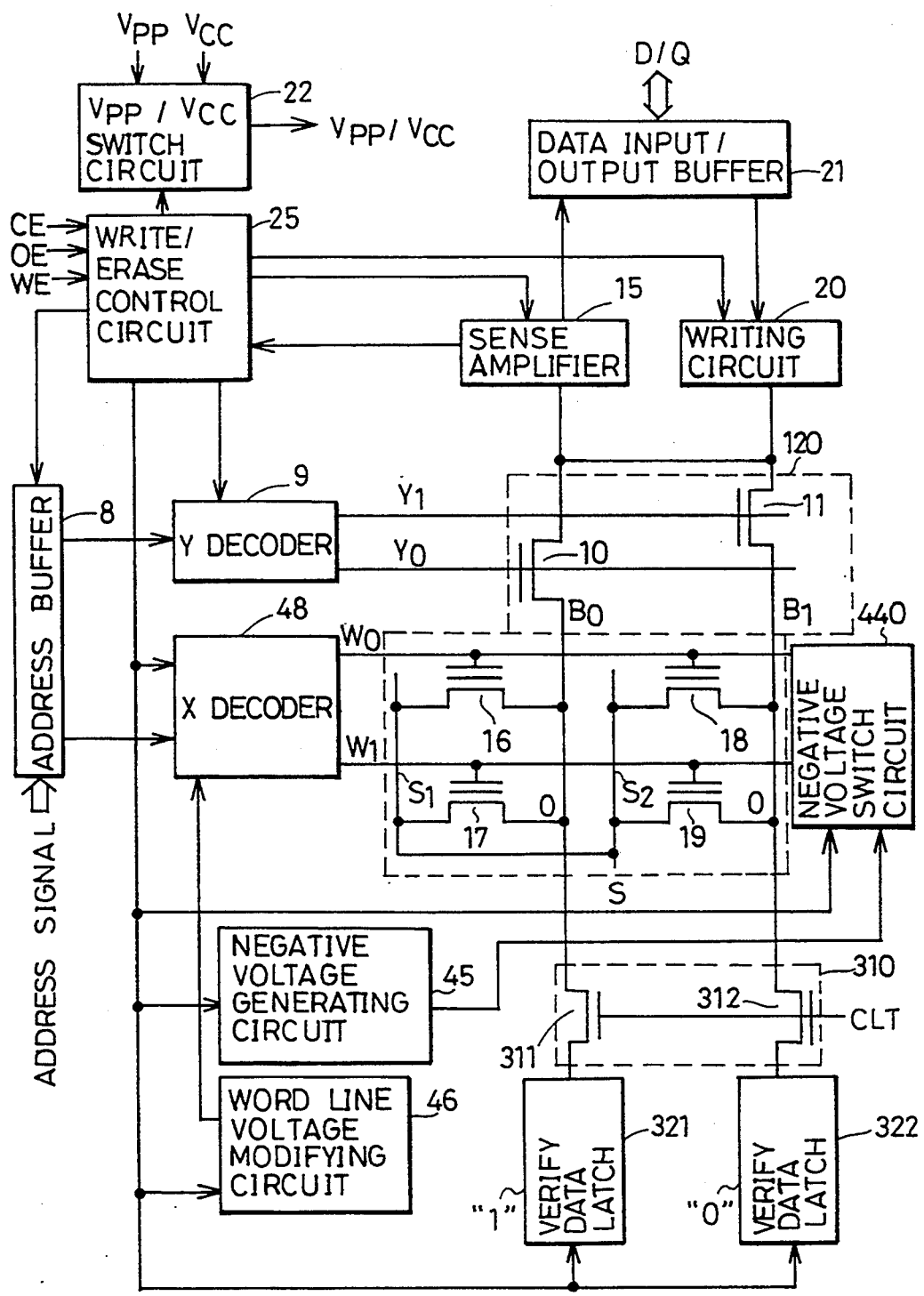
FIG. 20 is a diagram showing an entire structure of a non-volatile semiconductor device according to another embodiment of the present invention.

FIG. 20 shows an entire structure of a flash memory according to another embodiment of the present invention. FIG. 20 has the same reference numerals denoted corresponding to the same components of the flash memory of FIG. 10. Referring to FIG. 20, the flash memory includes verify data latches 321 and 322 provided corresponding to each of bit lines B0 and B1 for latching a verify data indicating whether the threshold voltage of the memory cell connected to the corresponding bit line is less than a predetermined threshold voltage, and a transfer circuit 310 responsive to control signal CLT for transferring the latch data in verify data latches 321 and 322 to respective corresponding bit lines B0 and B1.

Transfer circuit 310 includes an n channel MOS transistor 311 provided between verify data latch 321 and bit line B0 for receiving control signal CLT at its gate, and an n channel MOS transistor 312 provided between bit line B1 and verify data latch 322 for receiving control signal CLT at its gate.

Verify data latches 321 and 322 are activated in the erase operation mode (including both the operations of erase voltage application and erase verify) under the control of write/erase control circuit 25 with its latch data reset by write/erase control circuit 25. The other components are similar to those of the memory of FIG. 10. The operation will be described hereinafter.

The write operation and the read operation are similar to those of the flash memory in FIG. 10, and their description will not be repeated.

Figure 21:
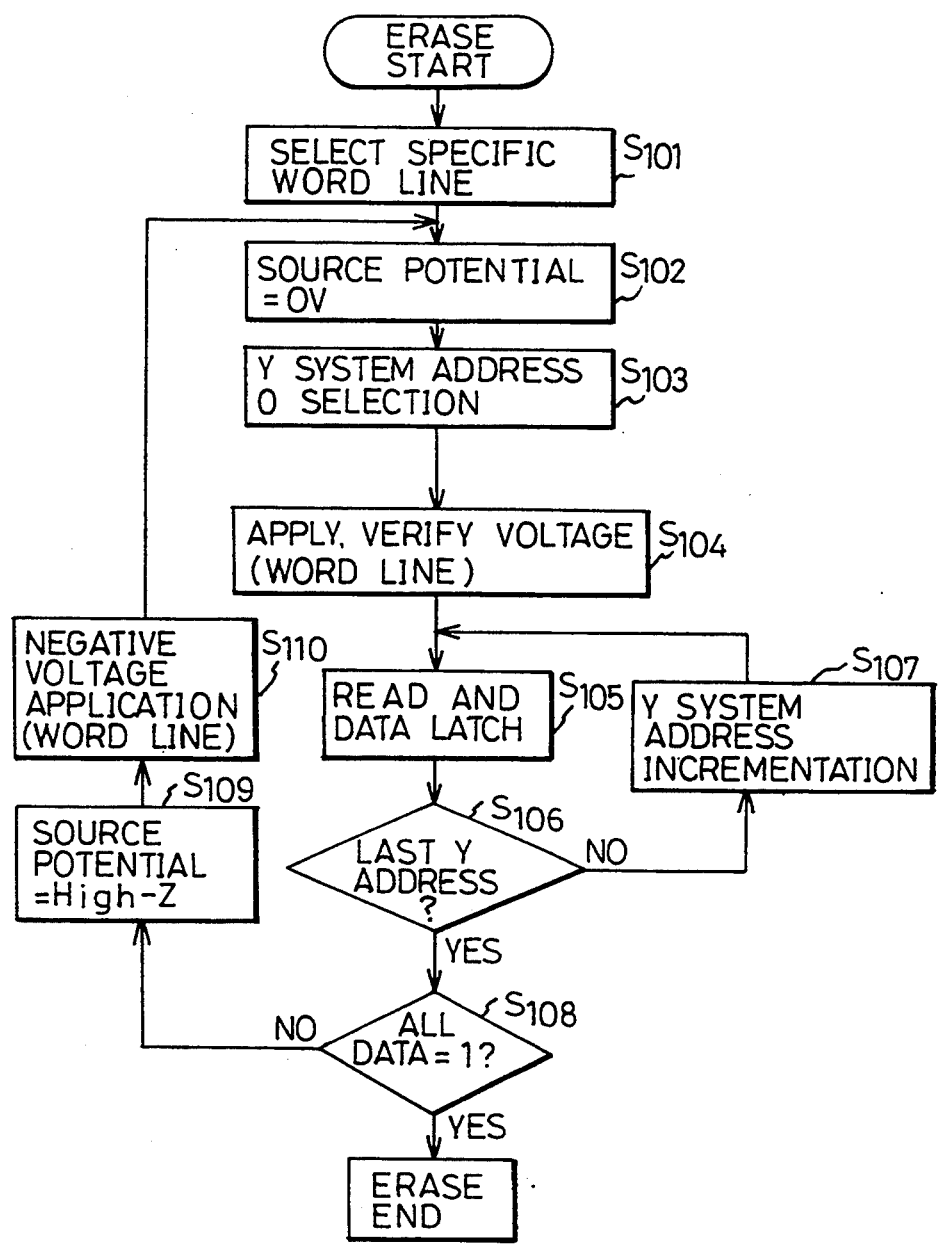
FIG. 21 is a flow chart showing the erase operation mode in the non-volatile semiconductor memory device of FIG. 20.

The erase operation mode will be described with reference to the operation flow chart of FIG. 21.

In response to an X address signal from address buffer 8, X decoder 48 selects a corresponding word line. It is assumed that the selected word line (specific word line) is word line W0 (step S101).

Then, the source potential generating circuit (not shown in FIG. 20 but provided as in the memory of FIG. 10) is operated to set the potentials of source lines S1 and S2 to the ground potential level of 0 V (step S102).

Under the control of write/erase control circuit 25, a column select signal (column select signal Y0) indicating a column of address 0 is generated from Y decoder 9 (step S103).

A predetermined verify voltage is generated from word line voltage modifying circuit 46 to X decoder 48. As a result, verify voltage VT2 is applied to the selected word line W0 (step S104).

Sense amplifier 15 is activated, whereby data in memory cell of address 0 of this column is read out. When this read out data is data "0" indicating a write state, write/erase control circuit 25 applies a write pulse to writing circuit 20. After sense amplifier 15 is inactivated, writing circuit 20 responds to the write pulse to generate an H signal. Here, a column of address 0 is selected, and an H signal from writing circuit 20 is transmitted to Y gate transistor 10 and bit line B0. Under this state, control signal CLT is set to a H level. This causes verify data latch 321 to be activated under the control of write/erase control circuit 25 to latch the data of H level provided from writing circuit 20 (step S105).

When the data read out from the memory cell is data "1" indicating an erase state, write/erase control circuit 25 does not provide a write pulse to writing circuit 20. Therefore, data of an L level indicating a reset state is latched in the verify data latch.

The above-described operation is carried out for each memory cell connected to the selected word line W0 (steps S106 and S107), followed by the determination of whether data of H level is latched in verify data latches 321 and 322 (step S108). In other words, determination is made whether the stored data in the memory cell connected to the selected word line W0 is "1" or not.

If there is at least one memory cell indicating data "0" in step S108, source potential generating circuit 24 sets source lines S1 and S2 to the high impedance state (step S109).

With control signal CLT maintaining a H level, selected word line W0 is set to a negative potential via negative voltage generating circuit 45 and negative voltage switch 44. The setting of a negative voltage of selected word line W0 is realized by using the above-described circuit configuration to generate erase signal ERASE in step S110. The negative potential may have an absolute value smaller than that of the above-described embodiment.

Verify data latches 321 and 322 latch a signal of a H level for memory cell having a threshold voltage greater than predetermined threshold voltage VT2. Therefore, a positive voltage of a H level (Vcc level) is applied on a corresponding bit line. A negative voltage is applied on the selected word line. Source line S attains a high impedance state. Thus, a high electric field is generated between the floating gate and the drain so that electrons are drawn from the floating gate to the drain region and the bit line by tunnelling current.

After one application of an erase voltage pulse, the control returns again to step S102 whereby the memory cell on selected word line W0 is read out sequentially. Determination is made whether the corresponding memory cell indicates an erase state or not (in this case, whether the threshold voltage is lower than predetermined threshold voltage VT2) according to the read out data result. Data indicating the determination result is written into a corresponding verify data latch.

For a memory cell where data changes from "0" to "1" during this operation, the corresponding verify data latch is reset so that the stored data attains a L level. Since writing circuit 20 provides a signal of a L level, data of a L level can easily be stored into a corresponding verify data latch.

Only a voltage of ground potential level is applied to the bit line connected to the reset verify data latch. Therefore, an electric field high enough to generate tunnel phenomenon between the floating gate and the drain region is not built up even if a negative voltage is applied to the selected word line W0. In this case, electrons are not drawn from the floating gate. Thus, erase operation is carried out only for a memory cell having a threshold voltage greater than verify voltage VT2.

The verify operation and the associated erase operation is carried out until all the memory cells connected to the selected word line W0 have a threshold voltage not more than the threshold voltage set by verify voltage VT2. With this operation method, an erase voltage pulse is not applied to a memory cell having a threshold voltage less than verify voltage VT2. This means that a very narrow distribution of threshold voltage can be realized with the maximum value of the threshold voltage of a memory cell as verify voltage VT2.

Figure 22:
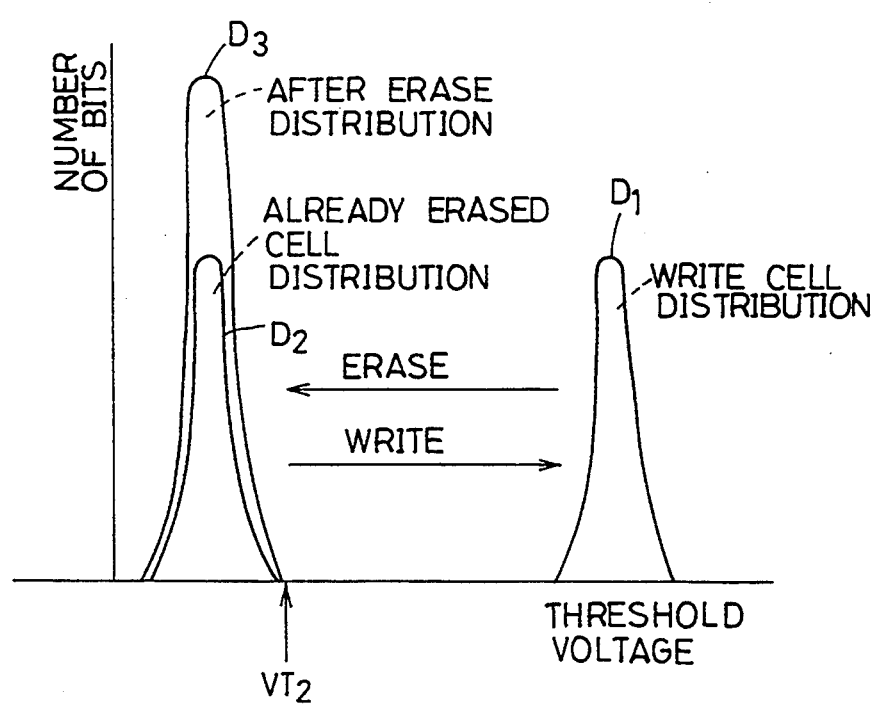
FIG. 22 is a diagram showing the distribution of the threshold voltage in a memory cell after the erase operation in the non-volatile semiconductor memory device of FIG. 20.

FIG. 22 shows a distribution of threshold voltage after the erase operation in the flash memory of FIG. 20. Curves D1 and D2 in FIG. 22 represent the distribution of threshold voltage of a memory cell connected to a specific word line, i.e. a word line including a memory cell to be programmed. Curve D1 shows a cell of a write state having a threshold voltage sufficiently higher than verify voltage VT2. Curve D2 shows the distribution of a memory cell having the threshold voltage less than verify voltage VT2 after an erasing operation. In the erase operation mode, the erase operation is carried out for memory cells represented by curve D1. As a result, a threshold voltage distribution is obtained in which threshold voltage is distributed in a very narrow range with verify voltage VT2 as the maximum threshold voltage (curve D3). The erase operation flow shown in FIG. 21 can be realized by implementing write/erase control circuit 25 with a simple microprocessor. Write/erase control circuit 25 may be implemented so that an external microprocessor executes its function when using a microcomputer incorporating the flash memory.

The two above-described embodiments have the distribution range of threshold voltage narrowed by carrying out an erase operation prior to the data writing operation where data is actually written into a memory cell. The former structure has the advantage of reducing drastically the time required for the erase operation mode. The structure will be described hereinafter.

Figure 23:
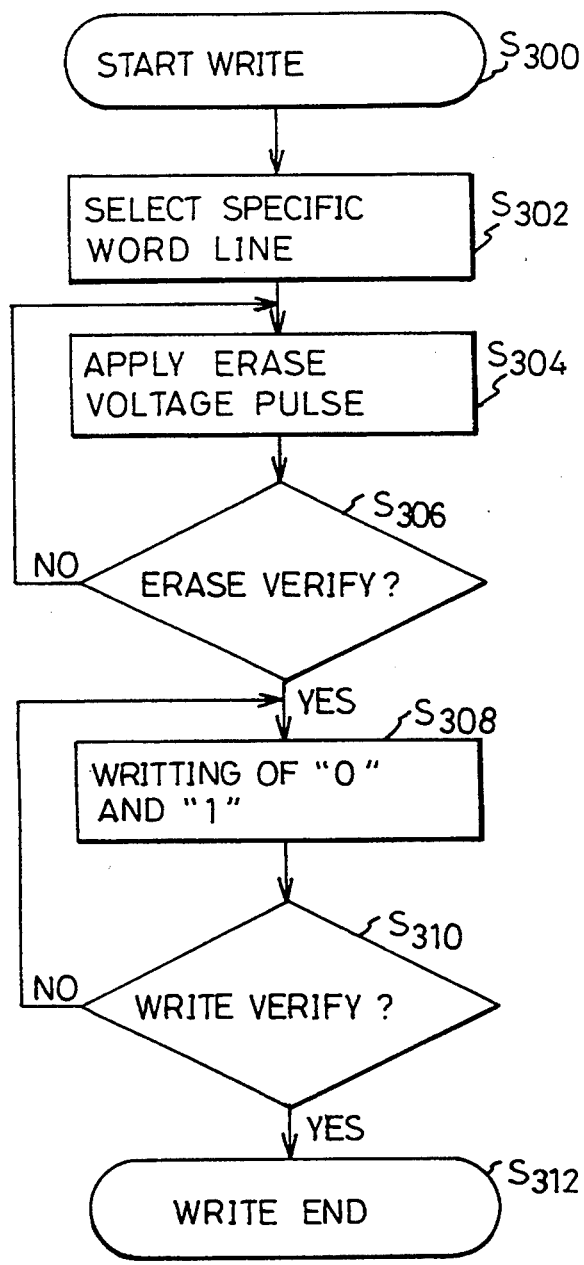
FIG. 23 is a flow chart showing the operation of a non-volatile semiconductor memory device according to a further embodiment of the present invention.

FIG. 23 is a flow chart showing the programming operation of a flash memory according to a further embodiment of the present invention. The programming operation mode of the flash memory will be described with reference to FIG. 23.

The programming operation mode is actuated by chip enable signal CE and write enable signal WE both attaining an active state (step S300). I response, a word line is selected connected to a memory cell to be programmed according to an address signal. Then, an erase voltage pulse of a sufficient level is applied to the memory cell connected to the selected word line (step S302). This erase voltage pulse must be great enough to set all the selected memory cells reliably into an erase state. The unit of an erase voltage pulse application to the region to which memory cells to be programmed are connected may be in units of a byte, a plurality of bytes, a word line, or may be implemented so that the erase voltage is applied simultaneously to all the memory cells. An erase operation in which erasing is carried out in the unit of one word line will be described hereinafter.

In applying an erase voltage pulse, an negative voltage is applied to the selected word line, voltage Vcc (approximately 5 V) is applied to the source line, and the bit line is set to a floating state, as in the preceding embodiments.

Then, an erase verify operation is carried out after the application of the erase voltage pulse (step S306). It is described that the erase voltage pulse has a level great enough to reliably set all memory cells to an erased state. However, an erase verify operation is carried out for confirmation. The erase verify operation is not required if the erase voltage pulse is significantly high. In the erase verify operation, the source line is set to ground potential, the potential of each selected word line is set to a predetermined verify voltage (slightly higher than 0 V), data of each memory cell is read out, and determination made whether data "1" is read out or not. If there is a memory cell not erased, the program returns again to step S304 to apply an erase voltage pulse. Upon completion of the erase verify operation, simultaneous writing of data "0" and "1" according to the programming data is carried out (step S308). This writing of data "0" and the "1" is carried out by the injection of electrons into the floating gate. After data is written, a write verify operation is carried out to verify whether the programming data is correctly written into each memory cell (step S310). The writing operation ends when data identical to the programming data is written into all the memory cells (step S312).

In the operation flow shown in FIG. 23, an erase voltage pulse is applied. There is the possibility of an excessively erased memory cell. However, an excessively erased memory cell stores data "1". When data "0" is written into the excessively erased memory cell to set a write state, the threshold voltage is reliably raised to a value indicating a write state by the write verify voltage.

In writing data "1" into the excessively erased memory cell, electrons are injected into the floating gate according to the embodiment. This means that the threshold voltage of the excessively erased memory cell is brought to an enhancement state from the depletion state because the threshold voltage rises. More specifically, the injection of electrons in writing data "1" is great enough to bring the threshold voltage of the excessively erased memory cell to an enhancement state, and set to a value sufficiently lower than that of writing data "0". The implementation of adjusting the electron injection efficiency for data "1" writing and data "0" writing will be described.

Figure 24:
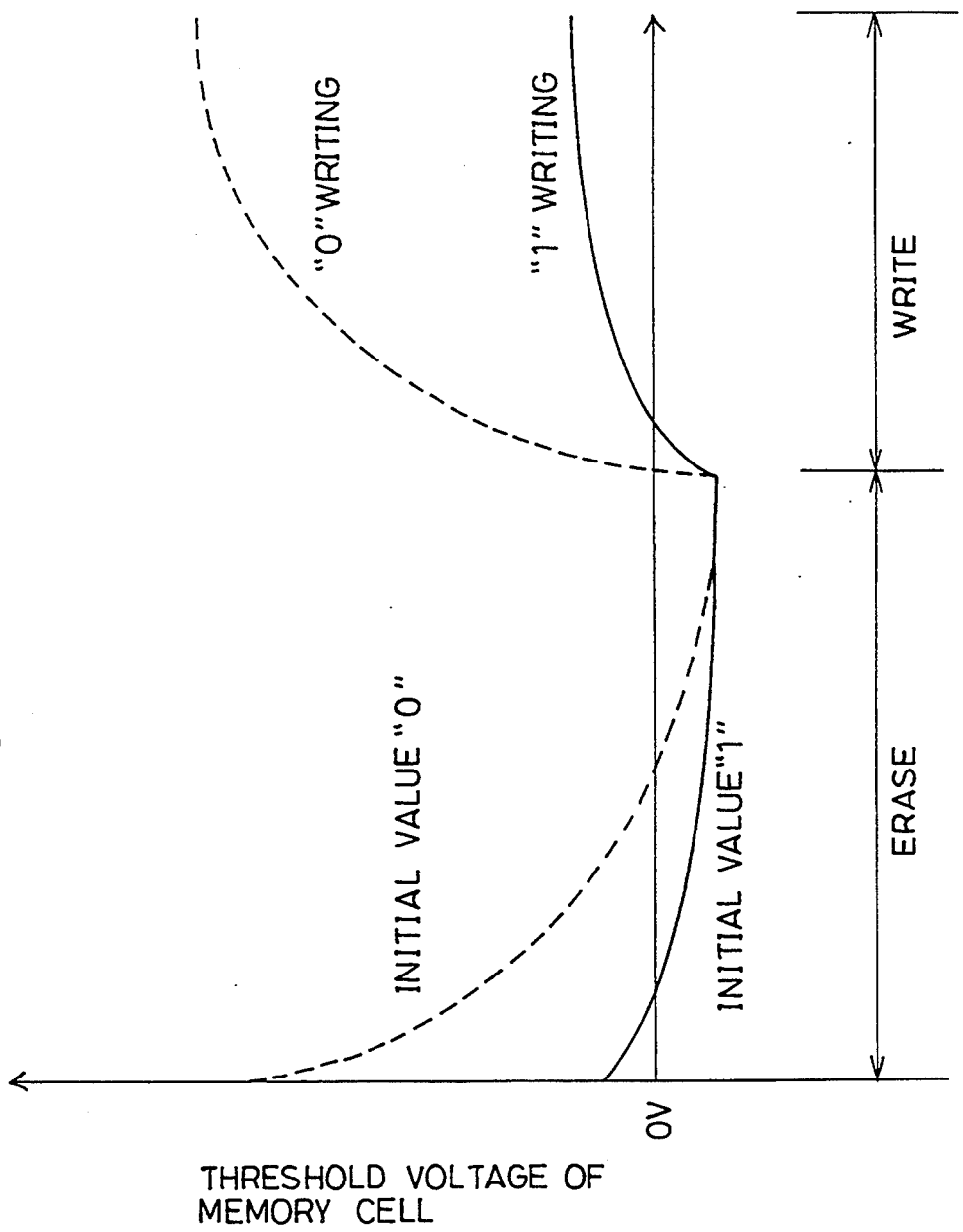
FIG. 24 is a diagram showing the first programming method of the operation flow chart of FIG. 23.

FIG. 24 shows the change in threshold voltage of a memory cell in a first programming operation mode according to still another embodiment of the present invention. In the graph of FIG. 24, the abscissa represents time, and the ordinate represents the threshold voltage of a memory cell.

According to the first programming method, an erase voltage pulse is applied. The threshold voltage of the selected memory cell prior to application of an erase voltage pulse depends upon the respective initial data of "0" and "1". The application of a sufficient erase voltage pulse brings all the threshold voltage of the memory cell to a state representing an erased state. The verify voltage in the erase verify mode is set to a value slightly greater than 0 V.

If an erase voltage pulse is applied several times or a great erase voltage pulse is applied, there is possibility of an excessively erased memory cell. The application of an erase voltage pulse causes electrons to be drawn from the floating gate to the source region by tunneling current. When the floating gate attains an excessive-erased state and positive charge increases, an electric field responsible for tunnel phenomenon is reduced so that tunnel phenomenon is not easily generated. This limits the minimum potential of the threshold voltage of the excessively erased memory cell to converge to a certain value.

After the threshold voltage of each selected memory cell is brought to a depletion state by the application of an erase voltage pulse, data "0" and "1" are written. In writing data "0", the charge injection to the floating gate is set to a sufficient great value. In writing data "1", the charge injection to the floating gate is set to a low value. The write pulse is applied until the threshold voltage of the memory cell attaining an erased state shifts from the depletion state to the enhancement state.

Figure 25:
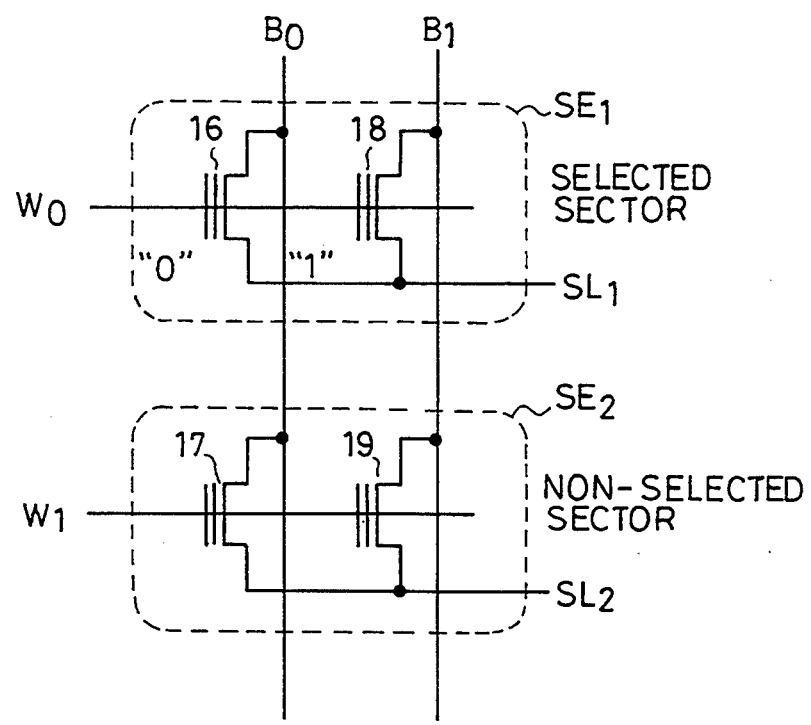
FIGS. 25(a)–25(b) are a diagram showing the voltage application conditions of a memory cell to realize the first programming method of FIG. 24.

FIGS. 25A and 25B are diagrams showing the voltage application conditions for realizing change in threshold voltage of the memory cell of FIG. 24. FIGS. 25A and 25B show a case where one erase unit is represented as one sector with two memory cells. Referring to FIG. 25A, source lines SL1 and SL2 are disposed parallel to word lines W0 and W1. The flash memories shown in FIGS. 10 and 20 have source lines S1 and S2 disposed parallel to bit lines B0 and B1. The structure shown in FIG. 25A has source lines SL1 and SL2 disposed parallel to word lines W0 and W1 for realizing data rewriting (programming) in a sector unit so that: each source lines SL1 and SL2 can have the potential set in sector unit. With reference to the structure of FIG. 25A, the voltage application conditions in writing data "0" to memory cell 16 and data "1" to memory cell 18 will be described.

At the time ore erase voltage pulse application, the memory cell to be programmed is included in sector SE1. In other words, sector SE1 is a selected sector, and sector SE2 is a non-selected sector.

At the time of erase operation, bit lines B0 and B1 are set to a floating state (FL). An negative voltage of −9 V is applied to word line W0, and word line W1 is set to ground potential. A voltage of 5 V is applied to source line SL1, and a voltage of 0 V of ground potential level is transmitted to source line SL2. The application of a negative voltage to selected word line W0 is implemented by using the structure of the negative voltage generating circuit, the negative voltage switch circuit, and X decoder 48 shown in FIGS. 10 and 20. Under this state, memory cells 16 and 18 included in sector SE1 has a high voltage applied to the control gate and the source region so that electrons of the floating gate is drawn to source line SL1 by tunnel phenomenon so that the threshold voltage is decreased.

In sector SE2, the potentials of word line W1 and source line SL2 are both 0 V of ground potential level so that no change occurs.

At the time of data writing, a writing voltage of approximately 4 V is applied to bit line B0 to which memory cell 16 in which data "0" is to be written therein is connected. At the time of data writing, the potential of selected word line W0 is set to a high voltage of 10 V. A relatively low writing voltage of approximately 2 V is applied to bit line B1 to which memory cell 18 is connected to which has data "1" to be written therein. In non-selected sector SE2, word line W1 and source line SL2 are both brought to a 0 V level of ground potential, and the potential of source line SL1 is set to 0 V.

Under this state, many hot electrons are injected into the floating gate caused by avalanche breakdown since bit line B0 has a high potential, resulting in a great rise in the threshold voltage of memory cell 16. In memory cell 18 having a low drain voltage 2 V, the amount of injected hot electrons caused by avalanche breakdown is low so that the degree of rise in threshold voltage is small. With this structure, memory cell 16 stores data "0" of a write state, and memory cell 18 stores data "1" of an erased state. At this time, memory cell 18 will not be excessively erased since electrons are injected into the floating gate with a rise in threshold voltage.

At the time of write verify operation, data "0" is written for an erroneous writing of data "0" as in the conventional case. If data "0" is erroneously written instead of data "1", all the memory cells in the selected sector SE1 are all set to an erase state. The possibility of such a state may be considered negligible since the rise in threshold voltage is appreciably low as a result of a low electron injection rate for data "1". When data "0" is erroneously written instead of data "1", an erase voltage pulse is applied again to carry out writing of data "1".

Data writing is carried out in access unit (1 byte unit, 1 word unit). In this case, one memory cell is considered to represent one access unit in the depicted structure.

Figure 26:
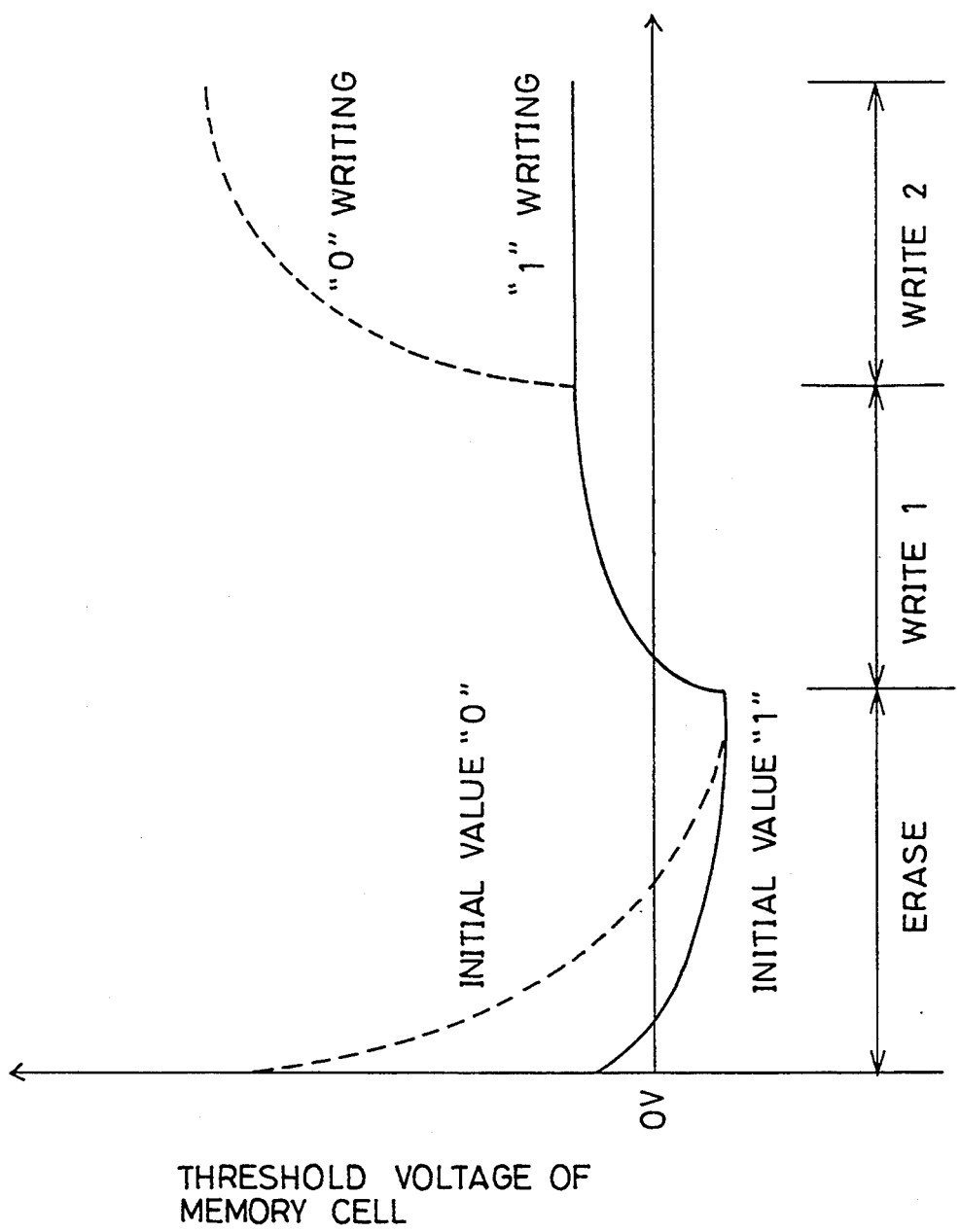
FIG. 26 is a diagram showing a second programming method of the flow chart of FIG. 23.

FIG. 26 shows another programming method. In FIG. 26, the abscissa represents time, and the ordinate represents the threshold voltage of a memory cell. The method shown in FIG. 26 has a data writing cycle including two data writing cycles of "writing 1" and "writing 2". At the first writing cycle of "writing 1", data "1" is first written into the memory cell to be programmed, and the threshold voltage of all the memory cells are brought to an enhancement state of low threshold voltage.

At the second writing cycle of "writing 2", data "0" is written into only the memory cells which should have data "0" written therein.

Figures 27A, 27B:
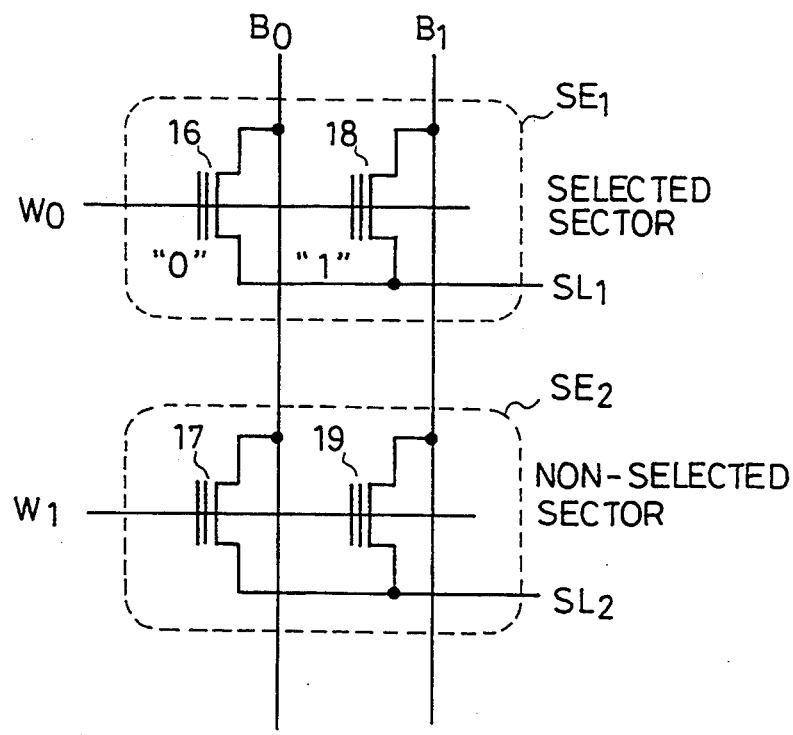
FIGS. 27(a)–27(b) are a diagram showing the voltage application conditions to each memory cell in the programming method of FIG. 26.

FIGS. 27A and 27B show the voltage application conditions of a memory cell according to the programming method of FIG. 26. FIGS. 27A and 27B shows the case where data "0" is written into memory cell 16, and data "1" is written into memory cell 18.

In the erase cycle, bit lines B0 and B1 attain a floating state (FL), and a word line W0 is set to a negative voltage of −9 V. A voltage of 5 V is applied to source line SL1. Word line W1 and source line SL2 take a 0 V level of ground potential. Under this state, an erase voltage pulse is applied to memory cells 16 and 18 so that electrons are drawn from the floating gate by tunneling current. As a result, the threshold voltage is lowered, whereby the memory cells attain a depletion state.

Then, data writing is carried out. In the cycle of "writing 1", a voltage of 4 V is applied to bit lines B0 and B1, and an voltage of 5 V is applied to word line W0. Word line W1, and source lines SL1 and SL2 are set to 0 V of ground potential. Under this state, the voltage applied to the control gates of memory cells 16 and 18 is low. As a result, the number of electrons injected into the floating gate is reduced, as shown in FIG. 12. The amount of change in threshold voltage is low so that the threshold voltage of memory cells 16 and 18 are brought to an enhancement state of a low value.

Then, the cycle of "writing 2" for writing data "0" is carried out. In this cycle, a voltage of 4 V is applied to bit line B0, and a voltage of 10 V is applied to the selected word line W0. The voltage of bit line B is set to 0 V. Because a high voltage of 10 V is applied to the control gate and a voltage of 4 V is applied to the drain region of memory cell 16, hot electrons generated by avalanche breakdown are injected into the floating gate to induce a great change in threshold voltage. The threshold voltage indicates a write state so that data "0" is written. In memory cell 18 where the potential of the drain region is 0 V, hot electrons are not generated so that the amount of electrons injected into the floating gate does not change. By carrying out the writing of data "1" and "0" in two stages, no excessively erased memory cell exists and reprogramming of a memory cell can be carried out speedily.

The implementation of a change in voltage applied to selected word line W0 in the "writing 1" cycle and "writing 2" cycle can be realizing using the above-described word line voltage modifying circuit. A word line driving signal of a desired voltage level can be obtained by modifying the control signal in the after-erase writing operation according to the writing cycle. When the writing voltage takes the structure shown in FIG. 27A, the writing high voltage generated by writing circuit 20 can be realized by reducing with bit line voltage modifying circuit 42 (refer to FIG. 10). Alternatively, the writing high voltage may be set to a level of 4 V.

FIG. 28 shows a further programming method. In FIG. 28, the abscissa represents time, and the ordinate represents the threshold voltage of a memory cell. In the programming method of FIG. 28, succeeding the execution of an erase operation, the "writing 1" cycle of writing data "1" is reduced, and the time period of the "writing 2" cycle for writing data "0" is increased. This is realized by modifying the writing pulse width according to data "0" and "1", or according to the writing cycle. This takes advantage of a small amount of change in the threshold voltage of a memory cell that accrue from a shorter time of a writing pulse application.

Figures 29A, 29B:
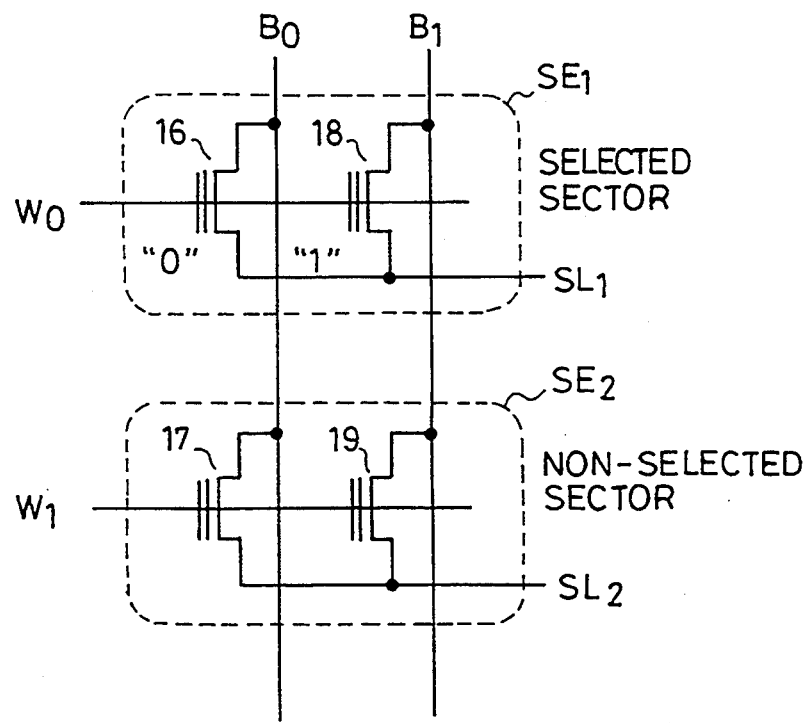
FIGS. 29(1)–29(b) are a diagram sowing the voltage application condition to each memory cell in the program method of FIG. 28.

FIGS. 29A and 29B are diagrams showing the voltage application conditions of a memory cell for realizing the programming method of FIG. 19. FIGS. 29A and 29B show voltage application conditions where programming is carried out in sector S1 including memory cells 16 and 18 in a memory cell array formed of memory cells 16–19 arranged in two rows and two columns. Data "0" and data "1" are written into memory cells 16 and 18, respectively. The erase conditions are similar to those of the prior embodiment where a voltage of −9 V is applied to selected word line W0 and a voltage of 5 V is applied to source line SL1. As a result, the threshold voltage of memory cells 16 and 18 are brought to a depletion state.

Next, the "writing 1" cycle is executed to write data "1". In this state, a voltage of 4 V is applied to bit lines B0 and B1, and a high voltage of 10 V is applied to word line W0. Source line SL1 is set to a level of 0 V of ground potential. In non-selected sector SE2, each signal line is set to 0 V. In this case, "writing 1" cycle is set to have a very short; application time of a writing pulse shown in FIG. 28. Therefore, the amount of electrons injected into the floating gates of memory cells 16 and 18 is low so that the threshold voltages of memory cells 16 and 18 are brought to an enhancement state of a low value.

Then, the writing of data "0" is carried out. This is carried out only for memory cell 16. In this case, a voltage of 4 V is applied to bit line B0, and a high voltage of 10 V is applied to word line W0. Bit line B1 is 0V of ground potential. Under the state, electrons are injected into the floating gate, as in the case of writing data "1". The "writing 2" cycle is set to have a writing pulse applying time period longer than that of the "writing 1" cycle. Therefore, there is a great rise in the threshold voltage of memory cell 16. The threshold voltage is brought to an enhancement state of a high level showing a writing state.

The implementation of a writing cycle of two stages with different writing pulse width can be realized by using the writing pulse width modifying circuit 43 shown in FIG. 10.

Modification of the word line voltage, the bit line voltage, and the writing pulse width for carrying out the writing of data "0" and data "1" may use the write pulse width modifying circuit 43, the bit line voltage modifying circuit 42, and the word line voltage modifying circuit 46 shown in FIG. 1. In this case, a control signal is generated according to each writing cycle instead of the after-erase write signal PAE of after-erase writing operation, as described before.

In the operation flow shown in FIG. 23, erase verify operation (step S306) is carried out after the application of an erase voltage pulse. However, the erase verify operation is not required if a sufficient change in threshold voltage is ensured of the erase voltage pulse. In other words, the erase verify operation does not have to be carried out if a depletion state can be ensured for the threshold voltage of each memory cell after the application of an erase voltage pulse. The erase verify operation ensures an maximum threshold voltage of a memory cell even in the worst case where all the memory cells are not brought to a depletion state.

Even if there is a rise in threshold voltage of the memory cell having a verify voltage level (erase verify voltage) in writing data "1", the rise is limited so that it is sufficiently lower than the threshold voltage indicating a write state. In these embodiments, the after-erase writing operation is simplified by carrying out the writing of data "1" instead of making uniform the range of threshold voltage and carrying out writing of data "0" thereafter. Although the sector indicating the programming unit is represented as one word line, it may be in a unit of bytes or a plurality of bytes.

The flash memory may take a structure where the memory cell array is divided into a plurality of blocks where access is carried out for each block.

In accordance with the invention of the above-described one aspect, after-erase writing operation is carried out for a memory cell having a threshold voltage lower than a predetermined threshold voltage after erase voltage pulse application to gradually modify the threshold voltage. As a result, the variation in threshold voltage is reduced to prevent erroneous reading and programming of data caused by an excessively erased memory cell.

In accordance with the present invention of the another aspect, an erase voltage pulse is applied only to a not-erased memory cell having a threshold voltage greater than a predetermined threshold voltage, so that an erase voltage pulse is not applied again to an erased memory cell. As a result, variation in threshold voltage of a memory cell after the erase operation is reduced to prevent erroneous operation caused by excessively erased memory cell.

In accordance with the invention of the one aspect and the another aspect, the pre-erase writing operation is not necessary for making uniform the threshold voltage of a memory cell before the application of an erase voltage pulse. Therefore, the time period required for an erase operation mode is reduced.

In accordance with the invention of the further aspect, the writing of data "0" and "1" is carried out after the memory cell is set to an erased state. This eliminates the need of different sequences for the erase operation mode and the write operation mode to simplify the control of the sequence for data programming. Also, the time period required for programming is reduced.

In accordance with the invention of the still another aspect, the injection rate of electrons into the floating gate differs in the writing of data "0" and the writing of data "1" to prevent erroneous writing of data. Because writing is carried out even for excessively erased memory cell, erroneous operation can be prevented caused by an excessively erased memory cell by a rise in threshold voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device including a plurality of floating gate type memory cells, comprising:
   selection means responsive to an address signal for selecting addressed memory cells among said plurality of memory cells;
   erasing means for applying an erasing voltage signal to said addressed memory cells in a programmable mode of operation;
   shifting means for applying a modifying signal to a selected memory cell of the addressed memory cells after application of said erasing voltage signal to shift a threshold voltage of the selected one, said modifying signal causing a smaller threshold voltage shift than the erasing voltage signal;
   identifying means for identifying a memory cell having a threshold voltage smaller than a predetermined value after application of said erasing voltage signal; and
   enabling means responsive to the identifying means for enabling said shifting means so as to increase a threshold voltage of this identified memory cell, said identifying means repeating the identifying operation after shifting operation by said shifting means until no memory cell is identified.

2. A non-volatile semiconductor memory device according to claim 1, wherein said erasing voltage signal has an amplitude large enough to bring the addressed memory cells into a depletion state, and wherein said shifting means includes a first shifting means, responsive to a data writing instruction, for increasing a threshold voltage of a memory cell by a first amount regardless of a first program data, and second shifting means, responsive to a second program data, for increasing a threshold voltage by a second amount greater than said first amount, said first and second shifting means carrying out a shifting operation through injection of electrons into a floating gate of a memory cell.

3. A non-volatile semiconductor memory device according to claim 1, wherein a floating gate type memory cell includes a first conduction terminal connected to a bit line connecting a column of the memory cells, a control gate connected to a word line connecting a row of the memory cells, another conduction terminal and a floating gate for accumulating electrons, and wherein said erasing means includes means for applying a negative voltage to control gates of the addressed memory cells through an associated word line, and means for applying a positive voltage to each another conduction terminal of the addressed memory cells.

4. A non-volatile semiconductor memory device according to claim 2, wherein said first shifting means is first activated, and then the second shifting means is activated.

5. A non-volatile semiconductor memory device according to claim 2, wherein said first shifting means and said second shifting means are activated concurrently with each other.

6. A non-volatile semiconductor memory device including a plurality of floating gate type non-volatile memory cells, comprising:

selection means responsive to an address for selecting addressed memory cells, detecting means responsive to an erasing instructing signal, for detecting, among the addressed memory cells by said selection means, a memory cell having a threshold voltage greater than a predetermined value; and erasing means responsive to said detecting means for applying an erasing voltage signal only to a memory cell detected by said detecting means to reduce a threshold voltage of such a detected memory cell, said detecting means including register means for storing data indicating a memory cell having a threshold voltage greater than the predetermined value, and said erasing means including means responsive to said data of said register means, for applying the erasing voltage signal to memory cells specified by said data of said register means.

7. A non-volatile semiconductor memory device according to claim 6, wherein each of said memory cells includes a first conduction terminal connected to a bit line connecting a column of memory cells, a control gate connected to a word line connecting a row of memory cells, another conduction terminal and a floating gate for accumulating electric charges, and wherein said detecting means includes register means provided for each bit line for storing detection data, identification means for identifying a memory cell having a threshold voltage greater than the predetermined value and setting the register means associated with thus identified memory cell, and said erasing means includes means for applying a negative potential to a word line associated with the addressed memory cells, and means for transferring data of the register means to each said bit line.

8. An electrically erasable and programmable non-volatile semiconductor memory device comprising:

a memory cell array including a plurality of memory cells arranged in a matrix of rows and columns, each storing information in a non-volatile manner, each of said memory cells including a floating gate type transistor, and having a write state for providing a first threshold voltage and an erase state for providing a second threshold voltage according to the amount of accumulated charge in said floating gate, a plurality of word lines provided corresponding to each row of said memory cell array, each having a memory cell of a corresponding row connected thereto, a plurality of bit lines provided corresponding to a column of said memory cell array, each having a memory cell of a corresponding column connected thereto, memory cell section means responsive to an applied address signal, for selecting a corresponding memory cell of said memory cell array, erasing means for applying an erase voltage to a memory cell selected by said memory cell selection means for setting each said-selected memory cell to said erase state, at the time of erase operation mode, determination means for making determination whether a first threshold voltage of each memory cell having said erase voltage applied thereto is not more than a predetermined value after application of said erase voltage, and modifying means for applying a threshold modifying voltage to a memory cell determined to haw a threshold voltage less than said predetermined value by said determination means, until the modified threshold voltage is not less than said predetermined value and lower than said first threshold voltage.

9. The non-volatile semiconductor memory device according to claim 8, wherein said modifying means comprises means for transferring to a selected word line and a selected bit line a modifying voltage of an energy lower than said erase voltage.

10. The non-volatile semiconductor memory device according to claim 8, wherein said erasing means comprises means for transferring a signal of negative potential to a selected word line and for transferring a signal of positive potential to a non-selected word line, and means for applying a voltage having a level identical to said positive potential to a conduction terminal not connected to a bit line of a memory cell.

11. An electrically erasable and programmable non-volatile semiconductor memory device comprising:

a memory cell array including a plurality of memory cells arranged in a matrix of rows and columns, each having a floating gate type transistor for storing information in a non-volatile manner according to the amount of accumulated charge in said floating gate, a plurality of word lines provided corresponding to each row of said memory cell array, each having a memory cell of a corresponding row connected thereto, a plurality of bit lines provided corresponding to each column of said memory cell array, each having a memory cell of a corresponding column connected thereto, memory cell selection means for selecting a corresponding memory cell according to an applied address signal, determination means for making determination whether the memory cell selected by said memory cell selection means has a threshold voltage not less than a predetermined threshold voltage, determination data storing means provided corresponding to each bit line for storing data indicating a determination result of said determination means for a memory cell connected to a corresponding bit line, and threshold modifying means responsive to data stored in said determination data storing means to apply an erase voltage parallelly and selectively to the memory cell selected by said memory cell selection means for setting the threshold voltage of the selected memory cell to a value not greater than said predetermined threshold voltage.

12. The non-volatile semiconductor memory device according to claim 11, wherein said threshold modifying means comprises means for transferring a negative potential to a selected word line, and for transferring to each bit line the data stored in said determination data storing means.

13. A non-volatile semiconductor memory device, comprising:

a memory cell array having a plurality of floating gate type non-volatile memory cells arranged in rows and columns, a plurality of word lines arranged corresponding to said rows and each connecting memory cells on the corresponding row, selection means responsive to an address for selecting a word line, erasing means responsive to an erase instruction signal for applying an erasing pulse to the memory cells on the selected word line by said selection means, detection means for detecting memory cells having a threshold voltage smaller than a predetermined value, after application of the erasing pulse, and modifying means responsive to said detection means for applying a modifying pulse to the memory cell detected by said detection means to cause a smaller threshold voltage shift than that caused by said erasing pulse, said detection means including:

identifying means for identifying a memory cell having a threshold voltage smaller than the predetermined value after application of said erasing voltage signal, enabling means responsive to the identifying means for enabling said modifying means so as to increase a threshold voltage of this identified memory cell, said identifying means repeating the identifying operation after shifting operation by said modifying means until no memory cell is identified.

* * * * *